(12) United States Patent
Clark et al.

(10) Patent No.: US 10,666,265 B2
(45) Date of Patent: May 26, 2020

(54) INTERFACE FOR PARALLEL CONFIGURATION OF PROGRAMMABLE DEVICES

(71) Applicant: Intel Corporation, Santa Clara, CA (US)

(72) Inventors: Kevin Clark, San Jose, CA (US); Scott J. Weber, San Jose, CA (US); James Ball, San Jose, CA (US); Simon Chong, San Jose, CA (US); Ravi Prakash Gutala, San Jose, CA (US); Aravind Raghavendra Dasu, San Jose, CA (US); Jun Pin Tan, Kuala Lumpur (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,849

(22) Filed: Sep. 28, 2018

(65) Prior Publication Data
US 2019/0103872 A1 Apr. 4, 2019

(51) Int. Cl.
*H03K 19/173* (2006.01)
*G06F 7/38* (2006.01)
*H03K 19/1776* (2020.01)
*H03K 19/17768* (2020.01)
*H03K 19/17704* (2020.01)
*H03K 19/17758* (2020.01)

(52) U.S. Cl.
CPC .... *H03K 19/1776* (2013.01); *H03K 19/17708* (2013.01); *H03K 19/17758* (2020.01); *H03K 19/17768* (2013.01)

(58) Field of Classification Search
None
See application file for complete search history.

(56) References Cited

U.S. PATENT DOCUMENTS

| 9,091,727 B1 * | 7/2015 | Lupu | G01R 31/31851 |
| 9,106,229 B1 * | 8/2015 | Hutton | H03K 19/173 |
| 2013/0181257 A1 * | 7/2013 | Ngai | H03K 19/17744 257/209 |
| 2019/0043536 A1 * | 2/2019 | Weber | G11C 5/025 |

* cited by examiner

*Primary Examiner* — Anh Q Tran
(74) *Attorney, Agent, or Firm* — Fletcher Yoder, P.C.

(57) ABSTRACT

An integrated circuit device may include programmable logic fabric disposed on a first integrated circuit die and having configuration memory. The integrated circuit device may also include a base die that may provide memory and/or operating supporting circuitry. The first die and the second die may be coupled using a high-speed parallel interface. The interface may employ microbumps. The first die and the second die may also include controllers for the interface.

27 Claims, 22 Drawing Sheets

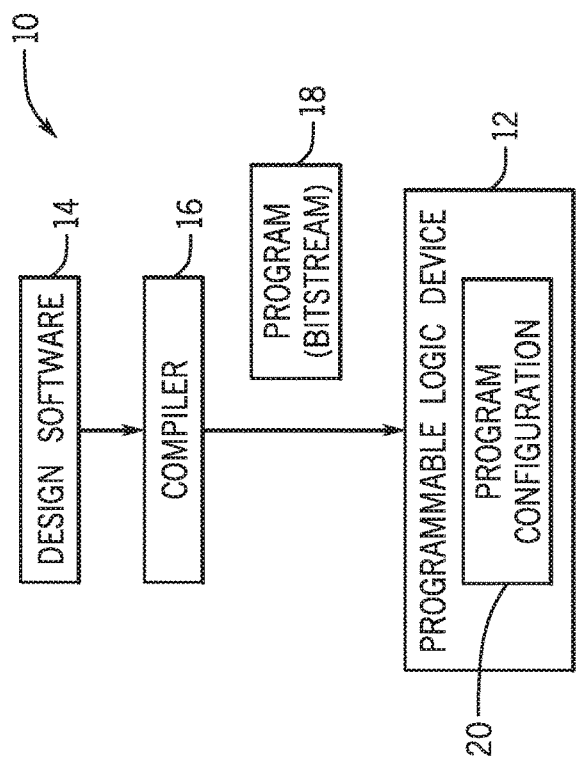
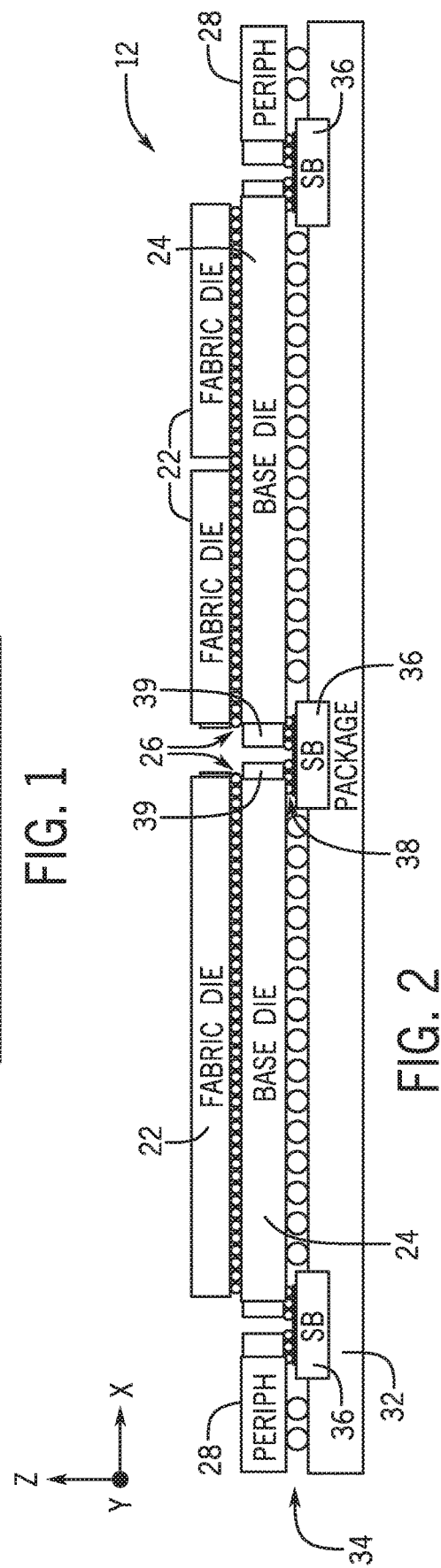
FIG. 1
FIG. 2

INTERFACE FOR PARALLEL CONFIGURATION OF PROGRAMMABLE DEVICES

BACKGROUND

This disclosure relates to interfaces for transfer of data in a multi-dimensional die a programmable logic device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed by a form of memory known as configuration random access memory (CRAM). Thus, to program a circuit design into a programmable logic device, the circuit design may be compiled into a bitstream and programmed into CRAM cells. A programmable logic device may also have embedded user memory, such as embedded random access memory (ERAM) and/or registers, that may provide direct access to the user memory and/or registers for testing a circuit design.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. As the computing tasks performed by the programmable logic devices become more complex, the speed for configuration and/or testing of the devices may become substantial.

BRIEF DESCRIPTION OF THE DRAWINGS

Various aspects of this disclosure may be better understood upon reading the following detailed description and upon reference to the drawings in which:

FIG. 1 is a block diagram of a programmable logic device that is programmed with a circuit design, in accordance with an embodiment;

FIG. 2 is a block diagram of a package including the programmable logic device where a fabric die is vertically stacked with a base die and coupled through a parallel configuration interface, in accordance with an embodiment;

DETAILED DESCRIPTION OF SPECIFIC EMBODIMENTS

Figure 3:
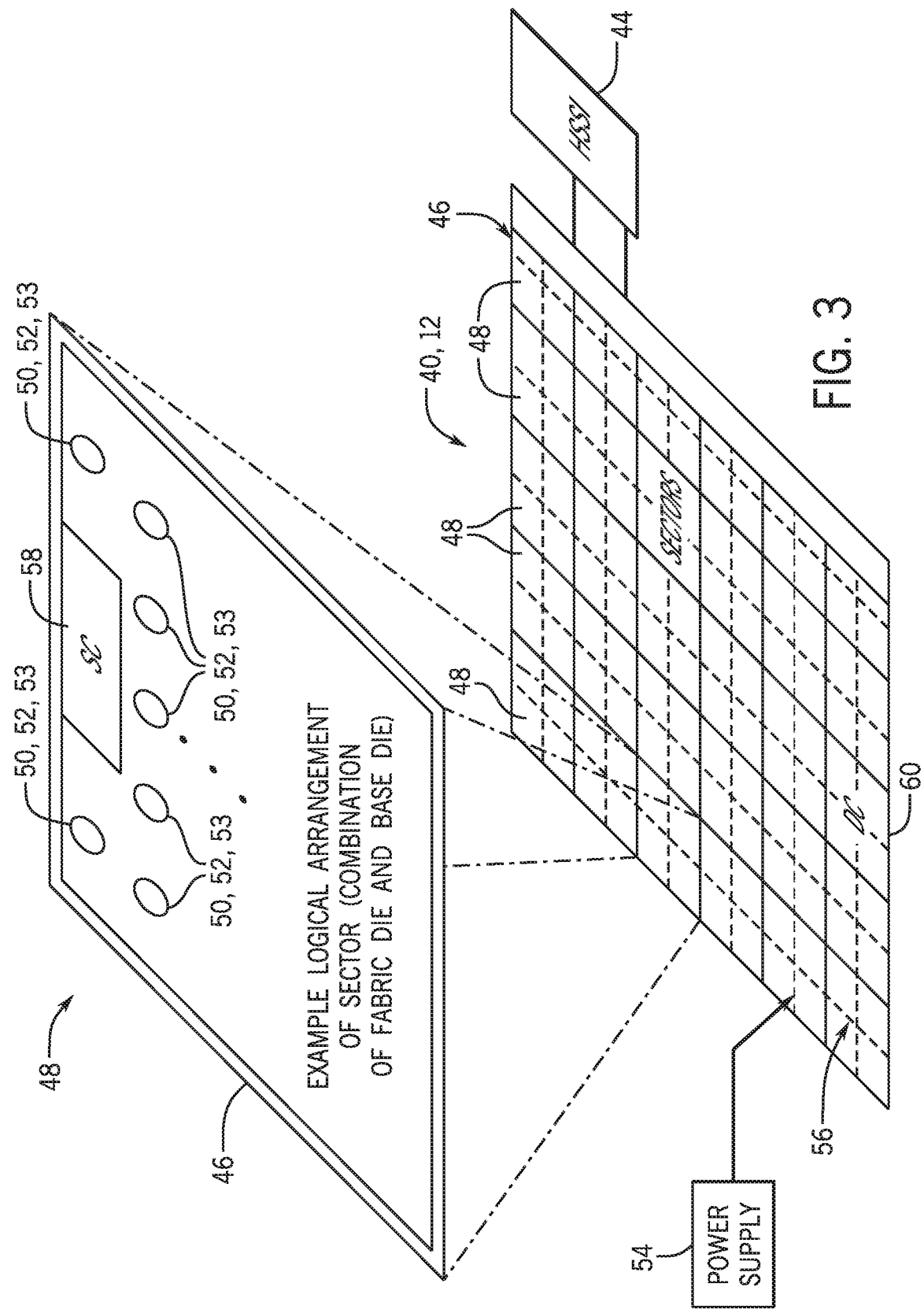
FIG. 3 is a block diagram of an example logical arrangement of the programmable logic device, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Programmable logic devices may be programmed by loading configuration data into configuration memory (e.g., configuration random access memory (CRAM)) that may be embedded in the programmable fabric. The configuration memory may store a logic design (e.g., state machines, truth tables, functions, etc.) that may control configurable logic circuitry to facilitate performance of the programmed tasks. Due to the flexibility afforded by the customizable and reconfigurable design, programmable logic devices are increasingly used as accelerators for machine learning, video processing, voice recognition, image recognition, and many other highly specialized tasks, particularly those that would be too slow or inefficient in software running on a processor. As the complexity of the tasks increase, the dimensions of the configuration data also increase, and may benefit from a high-speed interface for loading configuration memory.

Moreover, the flexibility in the operations of programmable logic devices allows reprogramming of the configuration memory. For example, a system using programmable logic devices may change context (e.g., change the type of operation performed) by loading new configuration data to the configuration memory. A high-speed interface may be used to increase the speed of the reprogramming operations, which may reduce the amount of idle time during which the reprogramming tasks is taking place. Programmable logic devices may also have user memory or user registers (e.g., flip flops). In some diagnostic situations, such as during debugging, testing, or emulation of a system design, direct and fast access to the user memory or user registers may increase the speed of diagnostic tasks. The programmable logic devices may have one or more test or register scan chains for testing, and direct and fast access to the user memory may increase the speed of test times.

With the foregoing in mind, the embodiments described herein are related to high-speed interfaces that may be used to read or write data into embedded memory in programmable logic devices. In certain embodiments, the programmable logic device may be composed of at least two separate die. The programmable logic device may include a first die that contains programmable logic fabric and embedded memory (e.g., configuration memory, user memory) and a second die that contains data exchange and management circuitry and memory. The first die and the second die may be coupled via a high-speed interface that allows parallel data exchange between the dies. Both the first die and the second die may include controllers to manage the access to the parallel high-speed interface. The coupling through the interface may take place via a high-density connection (e.g., microbumps).

Moreover, in some systems, in some embodiments the programmable logic die may be sectorized, as detailed below. In such systems, the fabric support circuitry in the base die may include network on chip (NOC) circuitry to send and/or receive data (e.g., configuration data, user data) with systems external to the programmable device and/or between sectors in the programmable devices. The fabric support circuitry may also include sector-aligned memory. In some embodiments, the sector-aligned memory may operate as a temporary storage (e.g., cache) for the configuration data or user memory. By incorporating the NOC into the fabric support circuitry, the NOC may resolve periphery shoreline bandwidth issues of the fabric, while increasing the bandwidth of the fabric. In addition, the communication routes available via the NOC embedded in the fabric support circuitry may enable the fabric to implement design relocations or reconfigurations, provide alternate pathways around powered-down sectors of the fabric, and provide security isolation features. Moreover, along with the use of the high-speed interface with interconnect parallelism (e.g., interface has multiple channels for exchange of data), sector parallelism (e.g., sectorized device allows loading data in multiple sectors simultaneously), and pipelining in the programmable fabric, the speed in which the fabric may be configured may increase substantially (e.g., by over 100 times, over 1000 times).

In addition to the above-described features, the fabric support circuitry may include, among other things, a device controller (sometimes referred to as a secure device manager (SDM)), a sector controller (sometimes referred to as a local sector manager (LSM), region controller), a configuration network on chip (CNOC), data routing circuitry, local (e.g., sectorized, sector-aligned, region-aligned) memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die.

By way of introduction, FIG. 1 illustrates a block diagram of a system 10 that may employ a programmable logic device 12 that can communicate via a network-on-chip disposed on a separate die that does not include programmable logic fabric, in accordance with embodiments presented herein. Using the system 10, a designer may implement a circuit design functionality on an integrated circuit, such as a reconfigurable programmable logic device 12, such as a field programmable gate array (FPGA). The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by bitstream 18, sometimes known as a program object file and/or configuration program, which programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform for machine learning, video processing, voice recognition, image recognition, or other highly specialized task.

To carry out the systems and methods of this disclosure, the programmable logic device 12 may take any suitable form that includes a high-speed parallel interface which increases the speed of communicating and data exchange across the sectors of the programmable logic device 12. The high-speed parallel interface may also accelerate the configuration process in which the bitstream may be programmed into the programmable logic device 12. As such, in one embodiment, the programmable logic device 12 may have two separate integrated circuit die coupled via the high-speed parallel interface.

One example of the programmable logic device 12 is shown in FIG. 2, but any suitable programmable logic device may be used. In the example of FIG. 2, the programmable logic device 12 includes a fabric die 22 and a base die 24 that are connected to one another via microbumps 26. The microbumps 26 may couple an interface in the fabric die 22 (e.g., an FPGA microbump interface (FMIB)) to an interface in the base die 24 (e.g., a base microbump interface (BMIB)), as detailed below. In the illustrated diagram of FIG. 2, the fabric die 22 and base die 24 are illustrated in a one-to-one relationship and in an arrangement in which a single base die 24 may attach to several fabric die 22. Other arrangements, such as an arrangement in which several base die 24 may attach to a single fabric die 22, or several base die 24 may attach to several fabric die 22 (e.g., in an interleaved pattern along the x- and/or y-direction) may also be used. Peripheral circuitry 28 may be attached to, embedded within, and/or disposed on top of the base die 24. Heat spreaders may be used to reduce an accumulation of heat on the programmable logic device 12. The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Although the microbumps 26 and the microbumps 38 are described as being employed between the fabric die 22 and the base die 24 or between the base die 24 and peripheral devices 28, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components (e.g., NOC) described herein.

In combination, the fabric die 22 and base die 24 may operate as a programmable logic device such as a field programmable gate array (FPGA) device. For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when both the fabric die 22 and the base die 24 operate in combination. In other words, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry (HSSI) 44 for driving signals off of the FPGA 40 and for receiving signals from other devices. The transceiver circuitry (HSSI) may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48 (e.g., region, portion).

Each programmable logic sector 48 may include a number of programmable logic elements 50 (also referred herein as FPGA fabric) having operations defined by configuration memory 52 (e.g., configuration random access memory (CRAM)). The programmable logic elements 50 may include combinatorial or sequential logic circuitry. For example, the programmable logic elements 50 may include look-up tables, registers, multiplexers, routing wires, and so forth. A designer may program the programmable logic elements 50 to perform a variety of desired functions. The programmable logic sector 48 may also include user memory 53. User memory may be in the form of embedded random access memory (ERAM), and/or memory blocks, such as M20K. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while the illustrated system includes 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 or user memory 53 based on control signals from the device controller 60. To that end and, as detailed below, the device controller may employ a data register (DR) and/or an address register (AR) to access data from the configuration memory 52 or user memory 53.

In addition to these operations, the sector controller 58 and/or device controller 60 may be augmented with additional capabilities. As described herein, a high-speed parallel interface may be used to coordinating memory transactions between local in-fabric memory (e.g., local fabric memory or CRAM being used for data storage) and sector-aligned memory associated with that particular programmable logic sector 48. Moreover, a NOC may be used to facilitate memory transactions between multiple sectors, multiple dies, and between the programmable logic device and external systems, as discussed herein. NOC may further be employed for decrypting configuration data (bitstreams) 18, and locally sequencing reads and writes to implement error detection and correction on the configuration memory 52 or user memory 53, and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes," and the local controller may be placed into any of those modes. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Sector controller 58 may include circuitry to manage the high-speed parallel interface (e.g., DR Intercept interface (DRIP)). The high-speed parallel interface may allow fast loading of DR circuitry, which may be used for configuration operations (e.g., CRAM operations), user memory operations (e.g., ERAM operations) and/or testing (e.g., scan chains operations). For example, a high-speed interface controller (e.g., DRIP Controller) that may be located in a fabric die and a second base die DRIP Controller may be used to coordinate operations in the DRIP interface, and may be part of the sector controller 58. The DRIP controllers and the NOC circuitry may also coordinate operations to perform multi-sector high-speed data exchange between base die and fabric die. Each sector controller 58 thus may communicate with the device controller 60, which may coordinate the operations of the sector controllers 58 and convey commands initiated from outside the FPGA 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins 44 and input/output circuitry 42. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 in the FPGA 40. The configuration memory 52 may provide a corresponding static control output signal that controls the state of an associated programmable logic element 50 or programmable component of the interconnection resources 46. The output signals of the configuration memory 52 may be applied to the gates of metal-oxide-semiconductor (MOS) transistors that control the states of the programmable logic elements 50 or programmable components of the interconnection resources 46.

Figure 4:
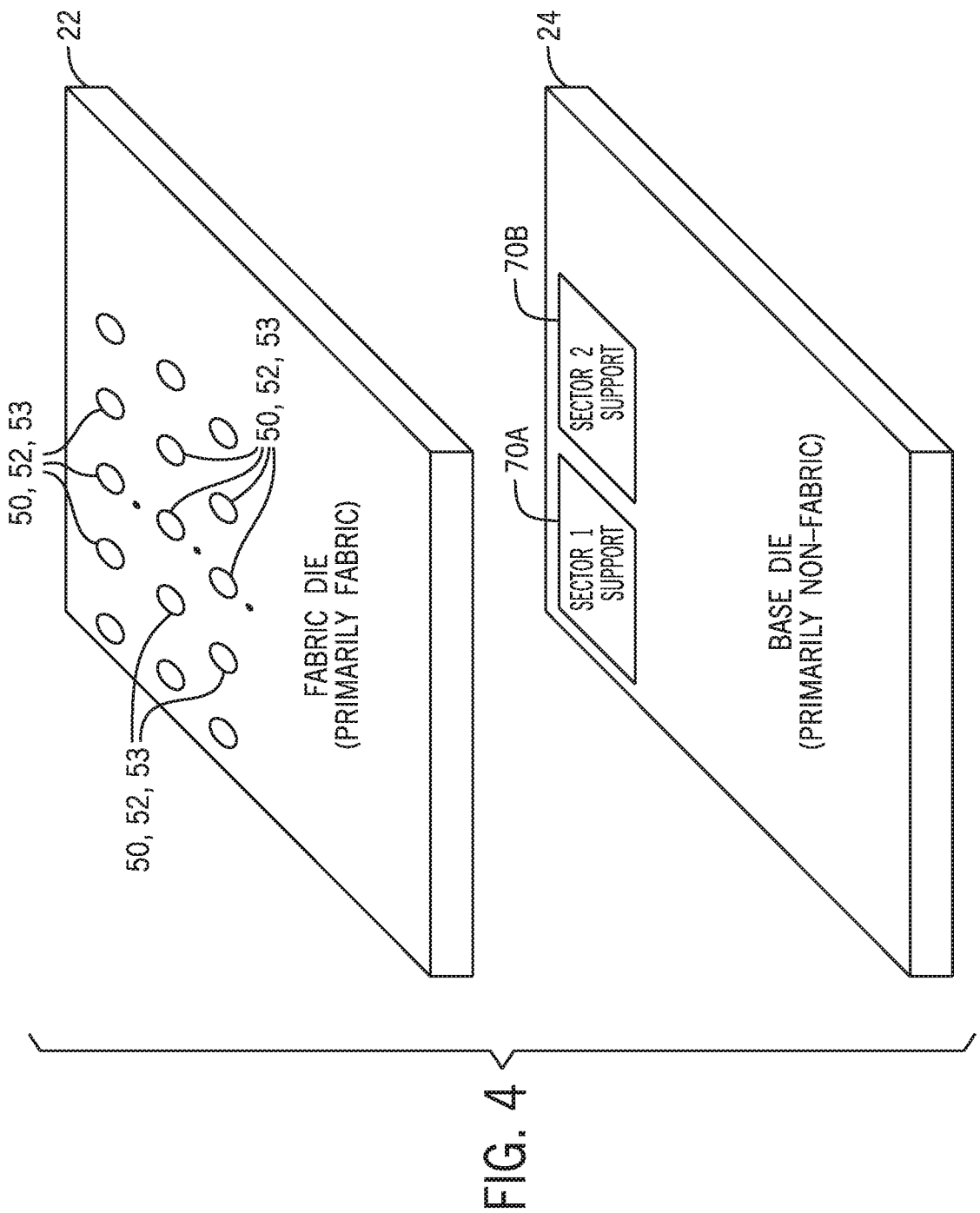
FIG. 4 is a block diagram showing a fabric die of the programmable logic device that contains programmable logic fabric with embedded memory and a base die of the programmable logic device that contains primarily non-fabric circuitry that support operations of the fabric die, in accordance with an embodiment.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50, configuration memory 52, and user memory 53. In some cases, this may also entail certain fabric control circuitry such as the sector controller (SC) 58 or device controller (DC) 60. The base die 24 may include supporting circuitry to operate the programmable logic elements 50, configuration memory 52, and user memory 53. Shown here, the base die 24 includes sector 1 support circuitry 70A and sector 2 support circuitry 70B to support two corresponding sectors of the programmable logic elements 50 and configuration memory 52 of the fabric die 22. The base die 24 may also include support circuitry for other sectors of the fabric die 22.

Figure 5:
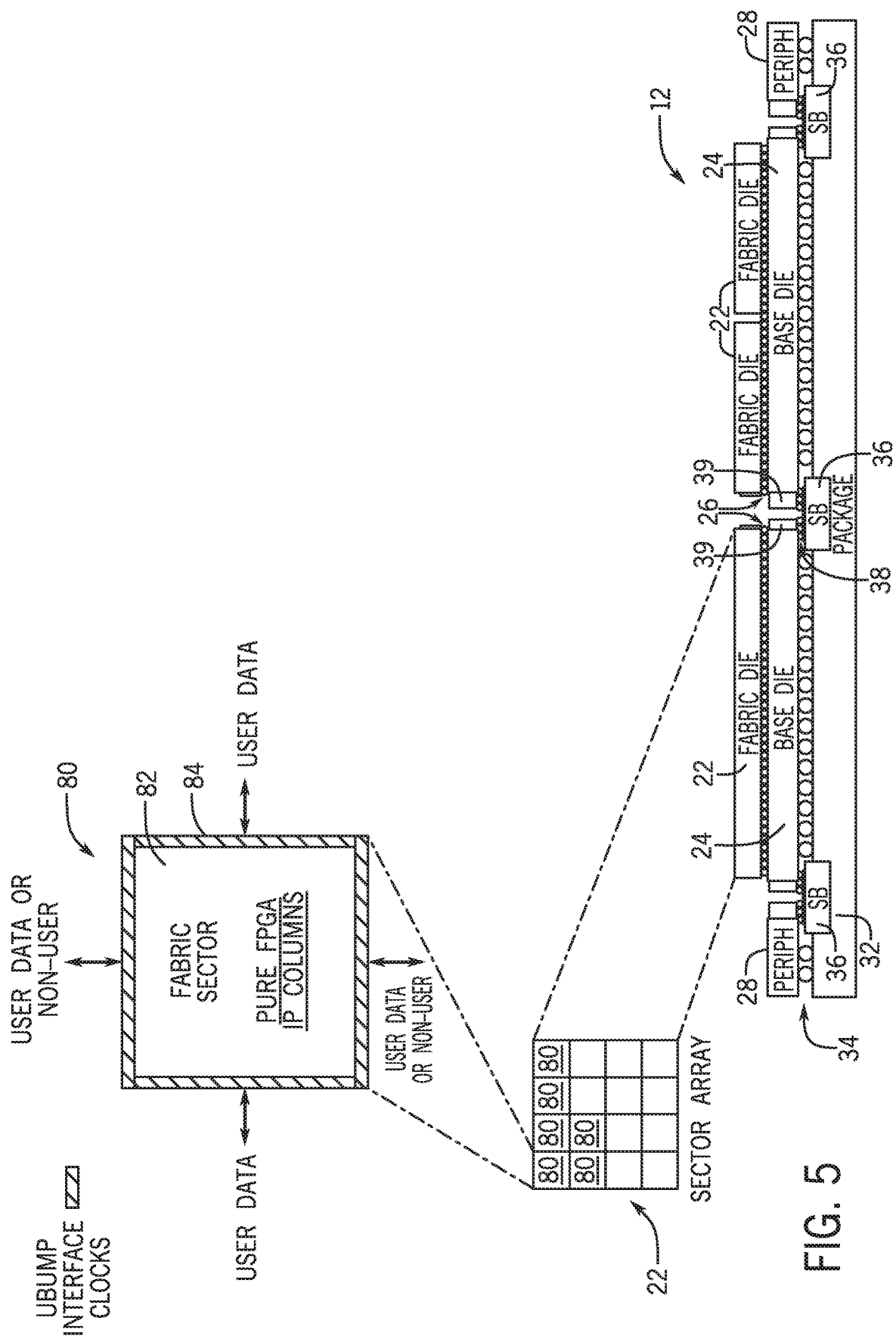
FIG. 5 is a block diagram of an example topology of the fabric die having a controller for the parallel interface and data register, in accordance with an embodiment.
Figure 6:
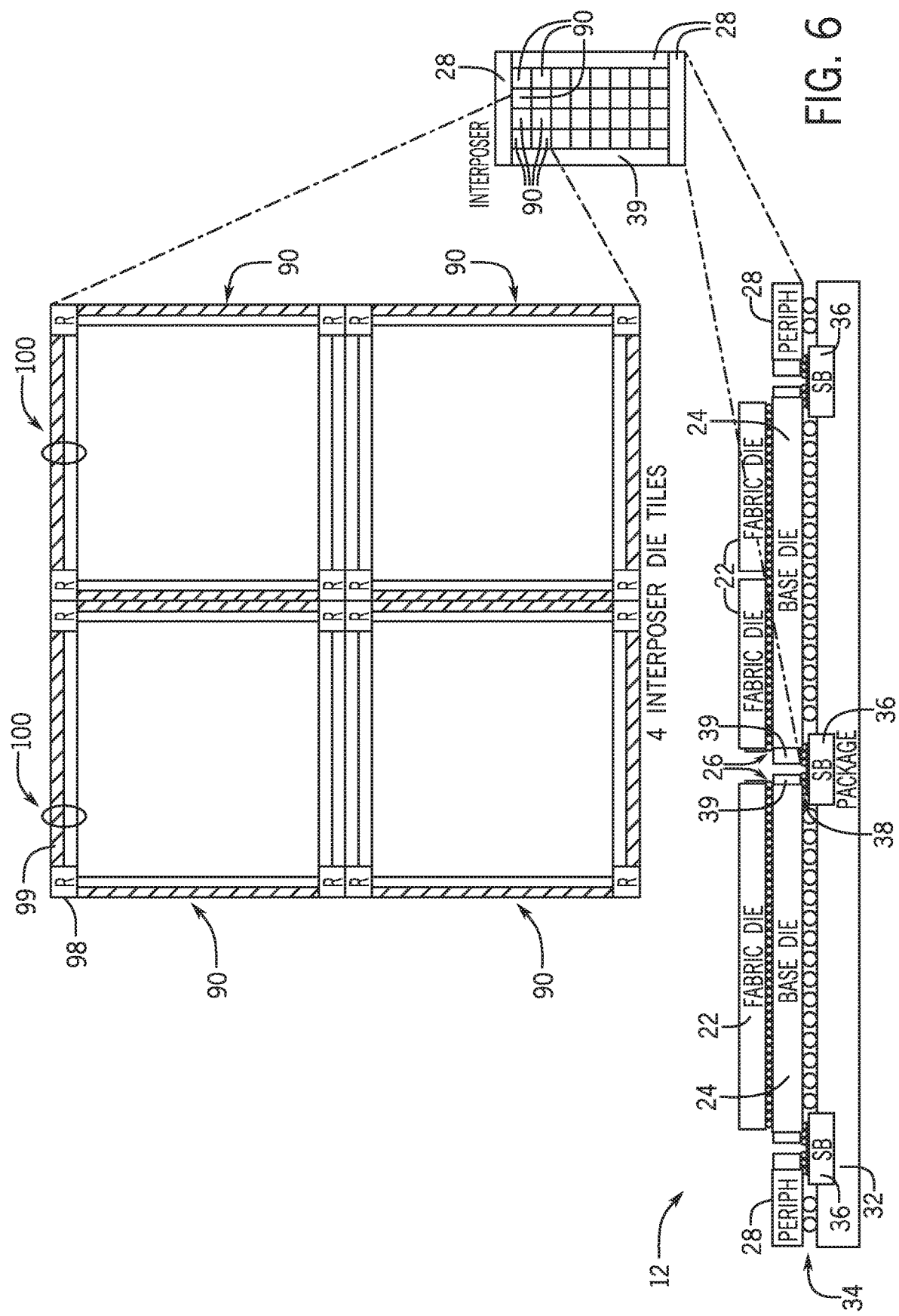
FIG. 6 is a block diagram of an example topology of the base die having an embedded network-on-chip (NOC) and a controller for the parallel interface, in accordance with an embodiment.

As discussed above, the high-speed interface (e.g., DRIP interface) may benefit from the presence of NOC circuitry in the base die (e.g., base die 24). The block diagrams in FIGS. 5, 6, 7, and 8 illustrate an example of a physical arrangement of the fabric die 22 and the base die 24 that may implement a NOC system. For example, a physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources or may include an interface to data routing and/or clocking resources on the base die 24. Thus, the interface circuitry 84 may connect with a microbump (μbump) interface to connect to the base die 24.

FIG. 6 provides an example complementary arrangement of the base die 24. The base die 24 may represent an active interposer with several sectors 90 surrounded by peripheral circuitry 28 and the silicon bridge interface 39. Although not shown in FIG. 6, each sector 90 may include a variety of fabric support circuitry, which may be described in greater detail below. In any case, the base die 24, in some embodiments, may include data and/or configuration routers 98, and/or data or configuration pathways 99. In some embodiments, portions of the data or configuration pathways 99 may communicate data in one direction, while other portions may communicate data in the opposite direction. In other embodiments, the data or configuration pathways 99 may communicate data bi-directionally.

With the foregoing in mind, the data and/or configuration pathways 99 may make up a network on chip (NOC) system 100. In the embodiment depicted in FIG. 6, the NOC system 100 may be integrated between each sector 90 of the base die 24. As such, the NOC system 100 may enable each of the sectors 90 disposed on the base die 24 to be accessible to each other. Indeed, the NOC system 100 may provide communication paths between each sector 90 via routers 98 or the like. In certain embodiments, the routers 98 may route user data between sectors 90 of the base die 24, to sectors 48 of the fabric die 22, and the like. Since the base die 24 is separate from the fabric die 22, the NOC system 100 may be continuously powered on, even when various sectors 48 of the fabric die 22 are powered down. In this way, the NOC system 100 of the base die 24 may provide an available route to different sectors 48 of the fabric die 22 regardless of the positions of powered down sectors 48.

In some embodiments, the NOC system 100 may include features such as Quality of Service management, Security Management, Debug and Performance measurement and Address virtualization services, and the like. In addition, the NOC system 100 may support caching features and interconnect protocols allowing the memory components of the programmable logic device 12 to be part of a coherent memory system supported by a caching agent.

By vertically aligning the fabric die 22 and the base die 24, the NOC 100 disposed on the base die 24 may physically span across the same surface area of the fabric die 22. In certain embodiments, microbumps may be positioned at various locations between the base die 24 and the fabric die 22 to enable the NOC 100 to communicate data between sectors 90 of the base die and sectors 48 of the fabric die 22. In the example embodiment of the NOC 100 depicted in FIG. 6, the NOC 100 may be positioned around each sector 90, which may be aligned with a corresponding sector 48 of the fabric die 22. As such, the NOC 100 may provide additional horizontal and vertical routing wires or pathways to facilitate to communication between sectors 48 of the fabric die 22, between sectors 90 of the base die 24, or between sectors 48 of the fabric die 22 and sectors 90 of the base die 24. The additional horizontal and vertical lines provided by the NOC 100 may reduce the amount of quantization performed by the programmable logic device 12.

Figure 7:
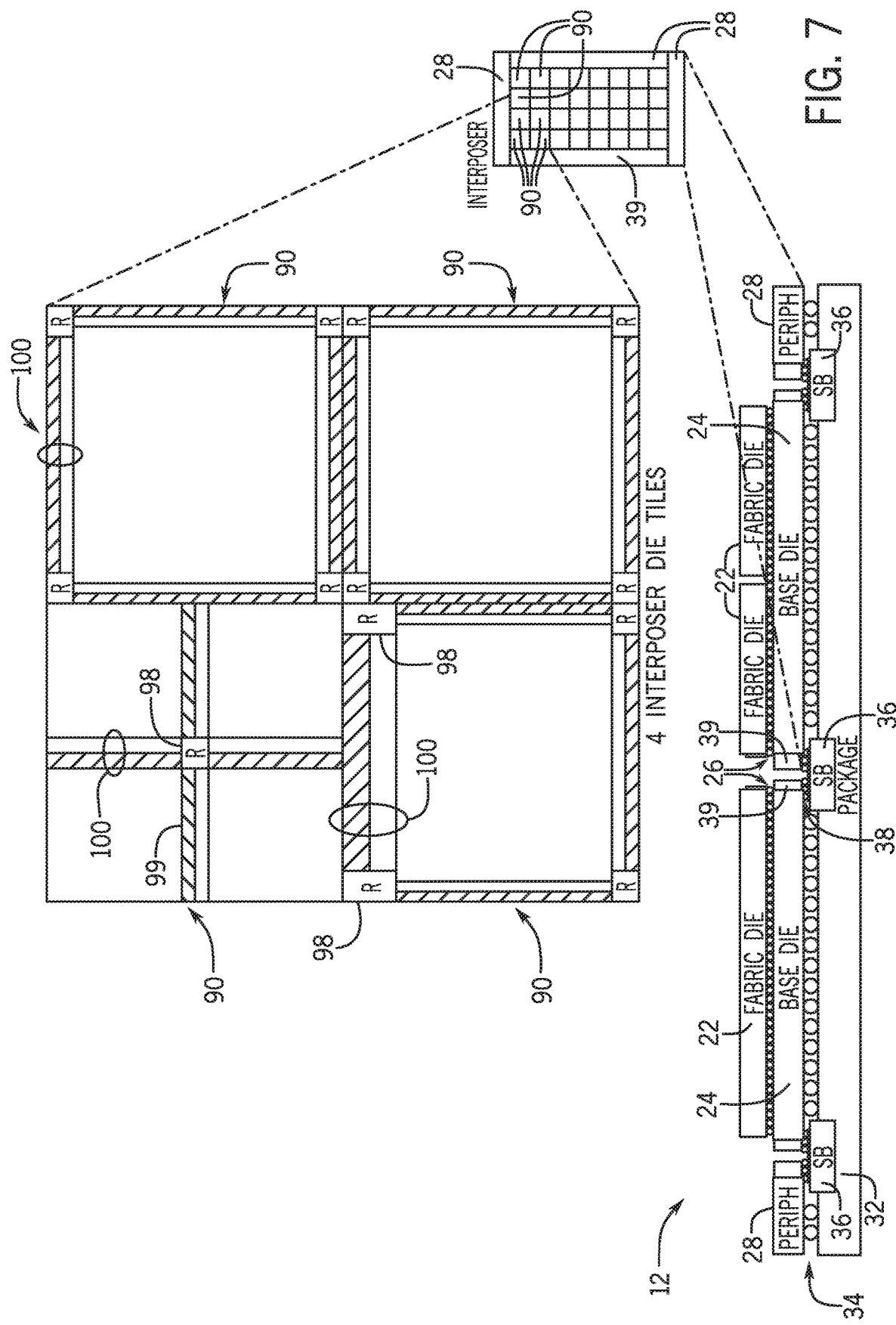
FIG. 7 is a block diagram of an example topology of the base die having a controller for the parallel interface and a different configuration of the embedded NOC, in accordance with an embodiment.

Although the data or configuration pathways 99 of the NOC 100 is illustrated in FIG. 6 as being routed around the sectors 90 of the base die 24, it should be noted that data or configuration pathways 99 of the NOC 100 may be routed across the base die 24 in any suitable manner. By way of example, FIG. 7 illustrates the NOC 100 implemented with data or configuration pathways 99 disposed across the center of the sector 90. As such, the router 98 may also be positioned in the center of the sector 90.

In addition, in some embodiments, the data or configuration pathways 99 of the NOC 100 may be wider in certain sectors 90 as compared to other sectors 90. In any case, it should be understood that the data or configuration pathways 99 may be incorporated into the base die 24, such that serve desired functions or operations that may be specific to the operations performed by the programmable logic device 12. That is, if the programmable logic device 12 includes functions that involve regularly transferring data across the fabric die 22, it may be beneficial to use more the base die 24 space to include data or configuration pathways 99 that take up more space on the base die 24 to provide increased bandwidth.

With the foregoing in mind, the NOC system 100 may include the data or configuration pathways 99 that allow for efficient multi-dimensional (e.g., three-dimensional, two-dimensional) integration of the NOC system 100 on the programmable logic device 12. Indeed, the NOC system 100 may enable the fabric die 22 to connect to the peripheral circuitry 28 and other parts of the fabric without communicating via the fabric die 22 or the programmable logic sectors 48 of the fabric die 22. That is, by employing the NOC system 100 in the base die 24, the programmable logic device 12 may increase the available bandwidth for communication across the programmable logic sectors 48 because the NOC system 100 provides additional pathways to different parts of the programmable logic device 12.

Figure 9:
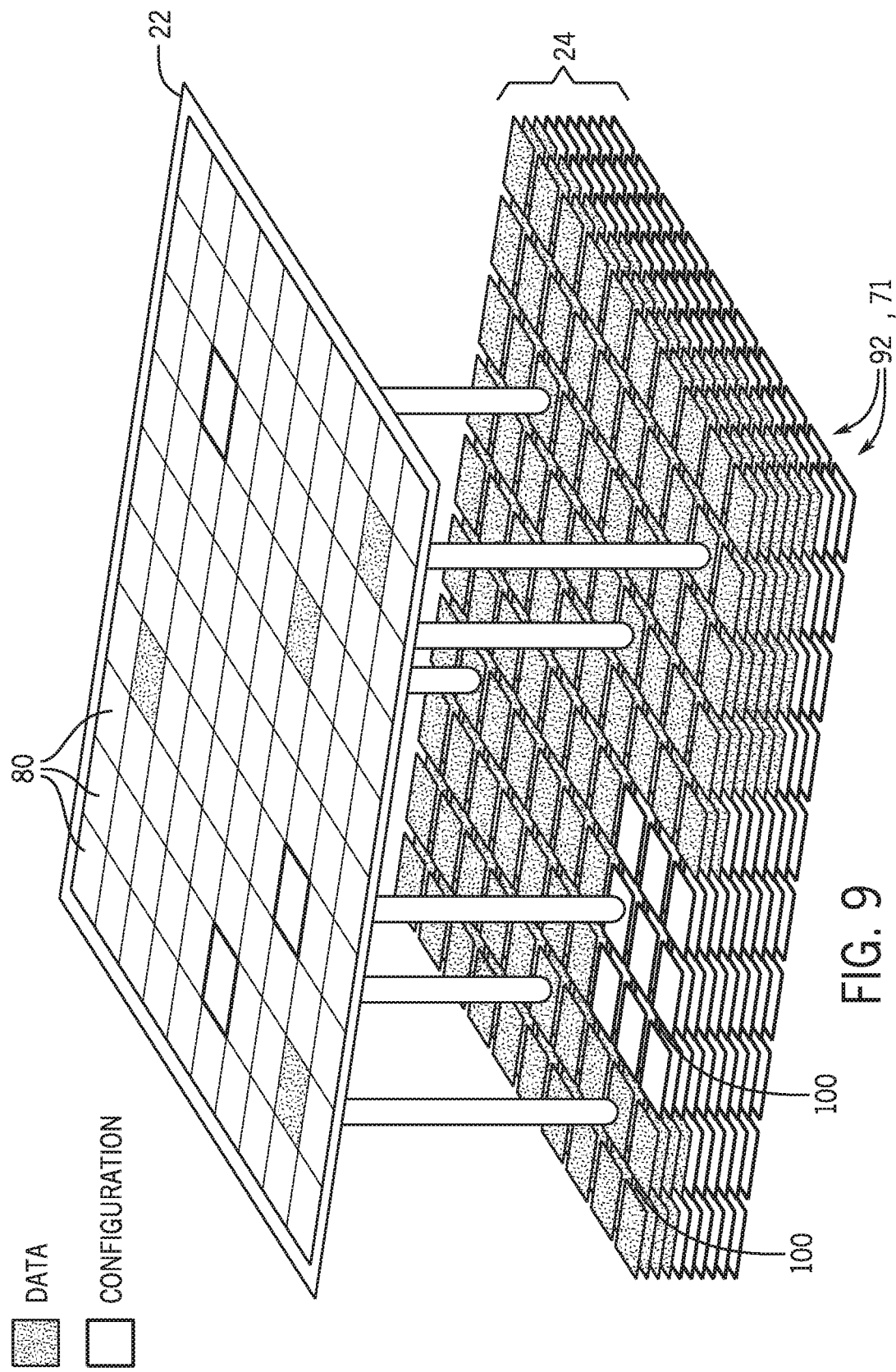
FIG. 9 is a block diagram of sector-aligned memory having embedded NOC circuitry integrated with a sector-aligned memory and configured to exchange data with the programmable logic die via the parallel interface, in accordance with an embodiment.

In addition, the NOC 100 resolves shoreline issues, supports fast reconfiguration, and enables relocate-ability of functions in the programmable logic sectors 48 based on the increased bandwidth and accessibility to different portions of the fabric die 22 via the base die 24. That is, as shown in FIG. 9, the NOC system 100 may be integrated with the sector-aligned memory 92 of the base die 24, such that it spans across the entire base die 24. As such, the NOC system 100 may access different fabric sectors 80 through various routes in the base die 24. In addition, the additional routes enable the NOC system 100 to serve as functional bypass around powered down sectors 80 without affecting the performance of the programmable logic device 12 by avoiding blockages across the programmable logic sectors 48 of the programmable logic device 12. That is, in some situations, certain sectors 80 of the fabric die 22 may be powered down, thereby preventing communication across the powered down sectors 80. In this case, the NOC system 100 may provide alternate communication pathways around the powered down sectors 80 to maintain communicative connectedness across the sectors 80 of the fabric die 22 regardless of whether certain sectors 80 are powered down.

The design relocate-ability of the programmable logic sectors 48 is also enhanced by the NOC system 100 because the NOC system 100 may access different sectors 80 of the fabric die 22. That is, the increased communication flexibility provided by the NOC system 100 being disposed in the base die 24 enables the programmable logic sectors 48 to be repositioned in various sectors 80 of the fabric die 22, while maintaining communication capabilities between the relocated programmable logic sectors 48.

Although FIGS. 6, and 7 illustrate two embodiments with different configurations for the NOC 100, it should be noted that the base die 24 may be configured to include a data or configuration pathways 99 in a variety of shapes, forms, positions, and the like. For example, the data or configuration pathways 99 of different sectors 90 may overlap each other, the entire sector 90 may incorporate the data or configuration pathway 99, or the like. In addition, microbumps may be used to facilitate communication between the NOC 100 and various sectors 80 of the fabric die 22 and the like.

Figure 8:
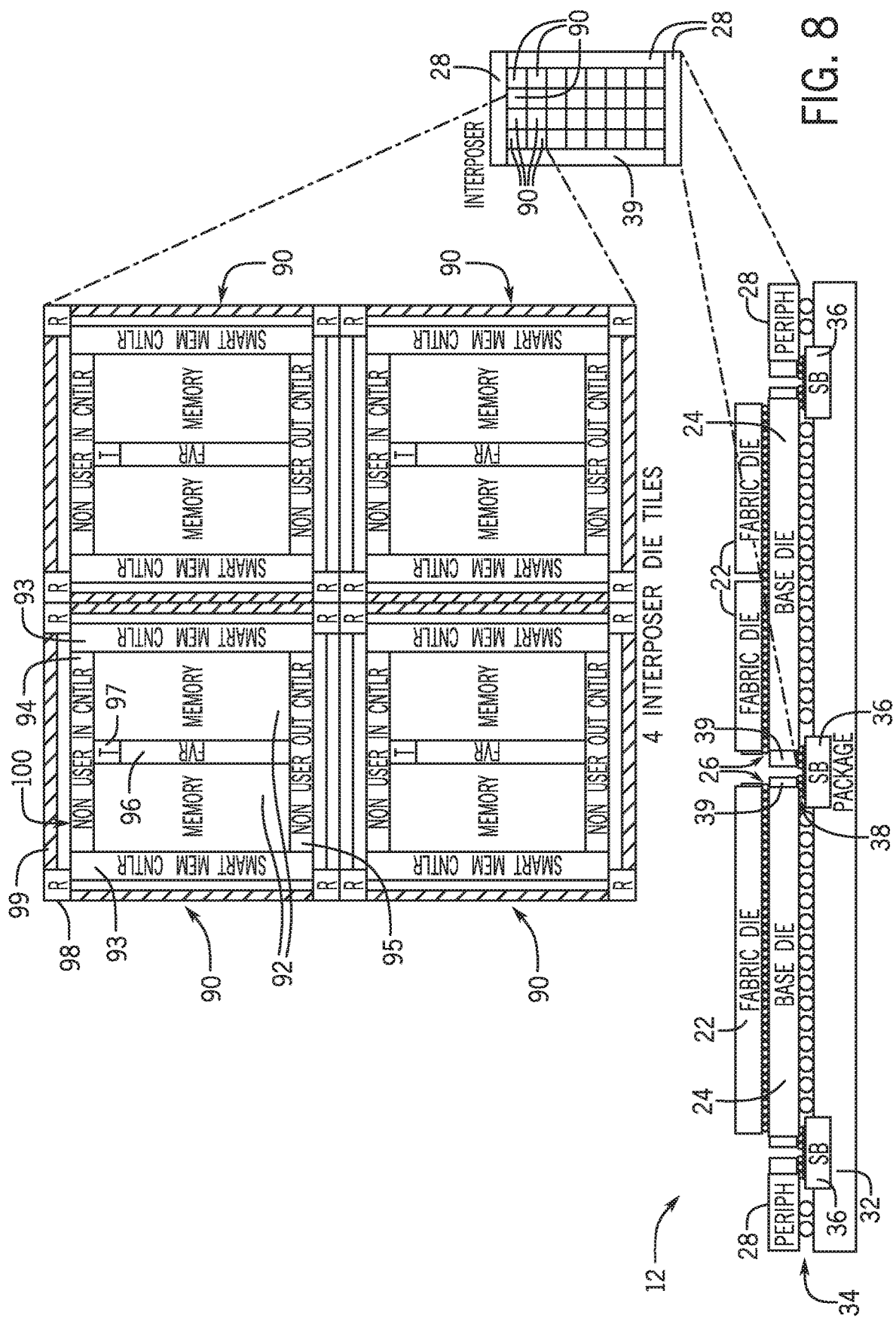
FIG. 8 is a block diagram of an example topology of the base die having a controller for the parallel interface and an embedded NOC integrated with a sector-aligned memory, in accordance with an embodiment.

In addition to facilitating communication of data between sectors 90, sectors 80, and the like, the presence of the NOC 100 in the base die 24 may also provide the programmable logic device 12 to incorporate additional circuit features by leveraging the NOC 100 of the base die 24 to improve the communication across the fabric die 22. By way of example, FIG. 8 provides another embodiment of an arrangement of the base die 24. Similar to the base die 24 described above, the base die 24 of FIG. 8 may represent an active interposer with several sectors 90 surrounded by peripheral circuitry 28 and the silicon bridge interface 39. As shown in FIG. 8, each sector 90 may include a variety of fabric support circuitry, such as sector-aligned memory 92, memory control circuitry 93, non-user input control circuitry 94, non-user output control circuitry 95, a voltage regulator such as a fully integrated voltage regulator (FIVR) 96, one or more thermal sensors 97, data and configuration routers 98, and/or data or configuration pathways 99.

Although the following description of the additional circuit features enabled by the NOC 100 embedded in the base die 24 focuses on the ability to transfer data to and from the sector-aligned memory 92, it should be noted that the additional circuit features are not limited to technologies involving the sector-aligned memory 92. Indeed, the NOC 100 embedded in the base die 24 may enable a variety of circuit operations to be performed more efficiently and effectively via the programmable logic device 12. However, for the purposes of discussion, certain operations that involve the sector-aligned memory 92 and the NOC 100 will be described to illustrate some of the functions enabled by incorporating the NOC 100 into the base die 24.

Referring back to FIG. 8, the memory control circuitry 93 may be used to program the sector-aligned memory 92, the CRAM of the fabric die 22, or both. The non-user input control circuitry 94 and non-user output control circuitry 95 may allow the circuitry of the sectors 90 to exchange data and/or control signals (e.g., via configurable data routing network-on-chip (NOC) or a configuration network on chip (CNOC)). In one example, the non-user input control circuitry 94 and non-user output control circuitry 95 may operate as the sector controller (SC) 58 for a corresponding fabric sector 80 (as shown in FIG. 5).

The FIVR 96 and the one or more thermal sensors 97 may be used to provide a desired voltage to the corresponding fabric sector 80 (as shown in FIG. 5), enabling the voltage to be selectively scaled up or down, or removed, depending on power and thermal specifications (e.g., based at least in part on temperature as measured by a thermal sensor 97 and/or in accordance with a dynamic voltage and frequency scaling (DVFS) scheme). Even though the thermal sensors 97 are in a separate die from that of the programmable logic fabric elements, when the base die 24 is directly adjacent to the fabric die 22 as in this example, the temperature measured by the thermal sensor 97 in the base die 24 may correspond well enough to the fabric die 22 to allow for temperature-based operations (e.g., turn off power to the corresponding fabric sector 80 to prevent a permanent-denial-of-service (PDOS) condition).

In certain embodiments, the data or configuration pathways 99 that make up the NOC system 100 may provide communication paths between each sector 90 via routers 98 mentioned above. As shown in FIG. 9, by vertically aligning the fabric die 22 and the base die 24 and incorporating the NOC 100 in the base die 24, memory located in the base die 24 may be accessible in parallel to fabric sectors 80 of the fabric die 22. FIG. 9 shows an example in which sector-aligned memory 92 may be contained in the base die 24. The sector-aligned memory 92 may be directly accessible to respective fabric sectors 80 of the fabric die 22 and may contain user data (generated by or accessible by a circuit design programmed into the programmable logic fabric of the base die 24) or configuration data that may be used to program the programmable logic fabric of the base die 24.

In this disclosure, "directly accessible" refers to a connection between a region of the sector-aligned memory 92 that is associated with a particular fabric sector 80. In some embodiments, each respective region of the sector-aligned memory 92 associated with a particular fabric sector 80 may be directly accessible to that particular fabric sector 80, thereby providing each fabric sector 80 with direct access to that region of the sector-aligned memory 92. For example, there may be N regions of sector-aligned memory 92 that can be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. Thus, in some cases, the same region of sector-aligned memory 92 may be directly accessible to multiple fabric sectors 80, while in other cases, a region of sector-aligned memory 92 may be directly accessible only to a single fabric sector 80. In the example of FIG. 9, the fabric sectors 80 may access specific regions of sector-aligned memory 92. The sector-aligned memory 92 is shown in FIG. 9 as vertically stacked memory. This may allow a large amount of memory to be located within the base die 24. However, the sector-aligned memory 92 may occupy a single plane of the base die 24 in some embodiments.

It should be noted that the fabric sectors 80 may initiate a transfer of data directly between memory locations of the sector-aligned memory 92 of the base die 24 using the NOC 100, between different fabric sectors 80 of the fabric die 22, between fabric sectors 80 and memory locations of the sector-aligned memory 92, and the like. In certain embodiments, the SC 58 or a soft controller (e.g., a controller implemented in local programmable fabric or a remote programmable fabric) may initiate the transfer of data between sectors 80 of the fabric die 22, between memory locations of the sector-aligned memory 92, between sectors 80 of the fabric die 22 and memory locations of the sector-aligned memory 92, and the like. That is, the SC 58 may coordinate the operation of the NOC 100 to facilitate the transfer of the data between the source and destination targets, as specified by the SC 58. In some embodiments, the SC 58 may act as a master to initiate the respective transfer and the transfer would then be performed using the NOC 100 after the SC 58 initiates the data transfer process.

Figure 10:
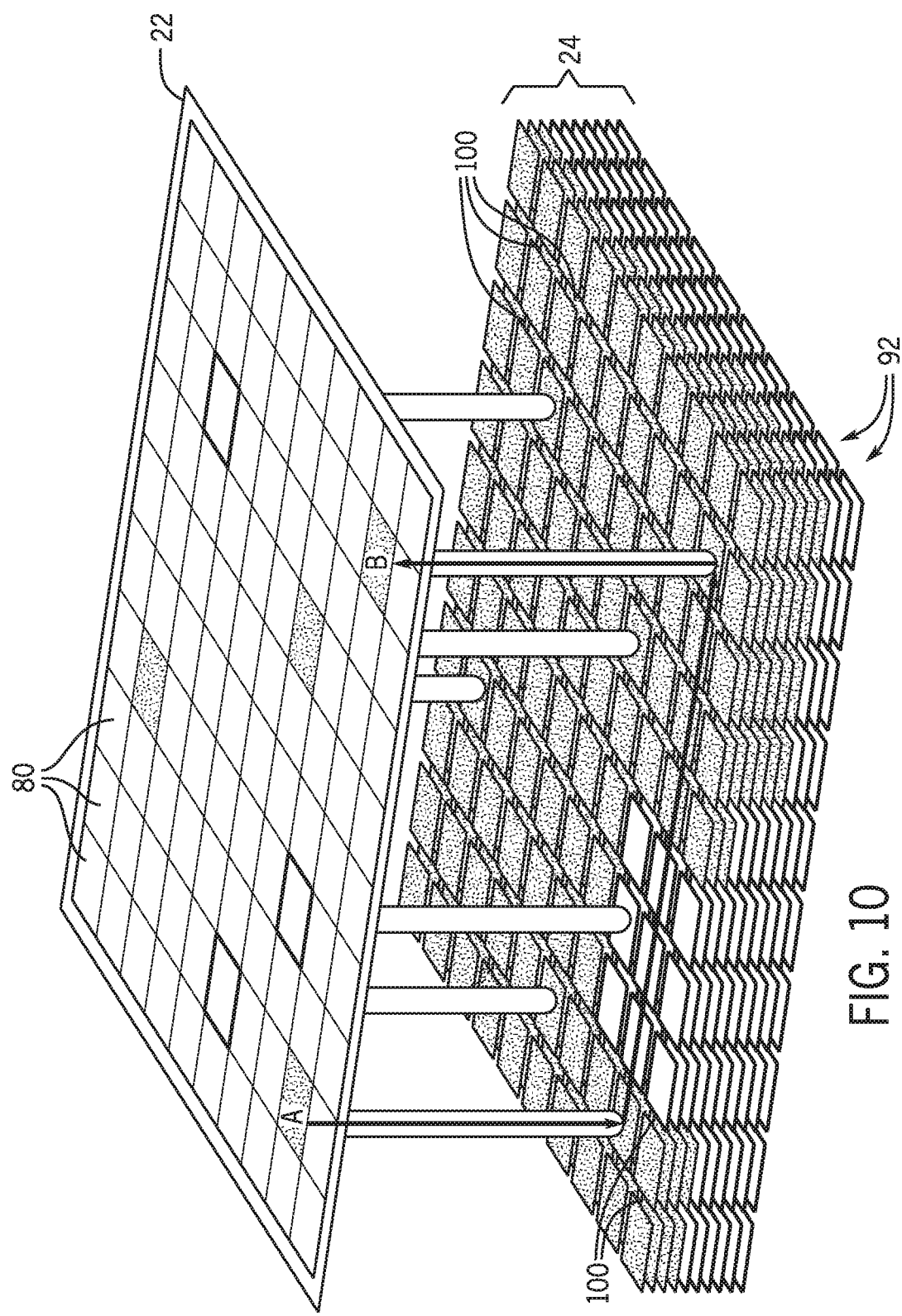
FIG. 10 is a an example of data transfer between sectors of the programmable logic fabric using the system of FIG. 9, in accordance with an embodiment.

By way of example, FIG. 10 includes a block diagram illustrating the transfer of data between sectors 80 of the programmable logic fabric via the NOC circuitry 100 of the base die 24. Referring to FIG. 10, in one embodiment, the sector controller (SC) 58 may initiate a transfer of data from sector "A" to sector "B" of the fabric die 22 using the NOC 100 of the base die 24. That is, the sector controller (SC) 58 may transfer data to a region of the sector-aligned memory 92 aligned with sector "A" of the fabric die 22, use the NOC 100 to transfer the data to a second region of the sector-aligned memory 92 aligned with sector "B" of the fabric die 22, and transfer the data from the second region of the sector-aligned memory 92 to sector "B" of the fabric die 22. Although the route of the data transfer illustrated in FIG. 10 corresponds to straight paths, it should be noted that the data transferred to different sectors 80 of the fabric die 22 or regions of the sector-aligned memory 92 may use a variety of directions and routes.

Figure 11:
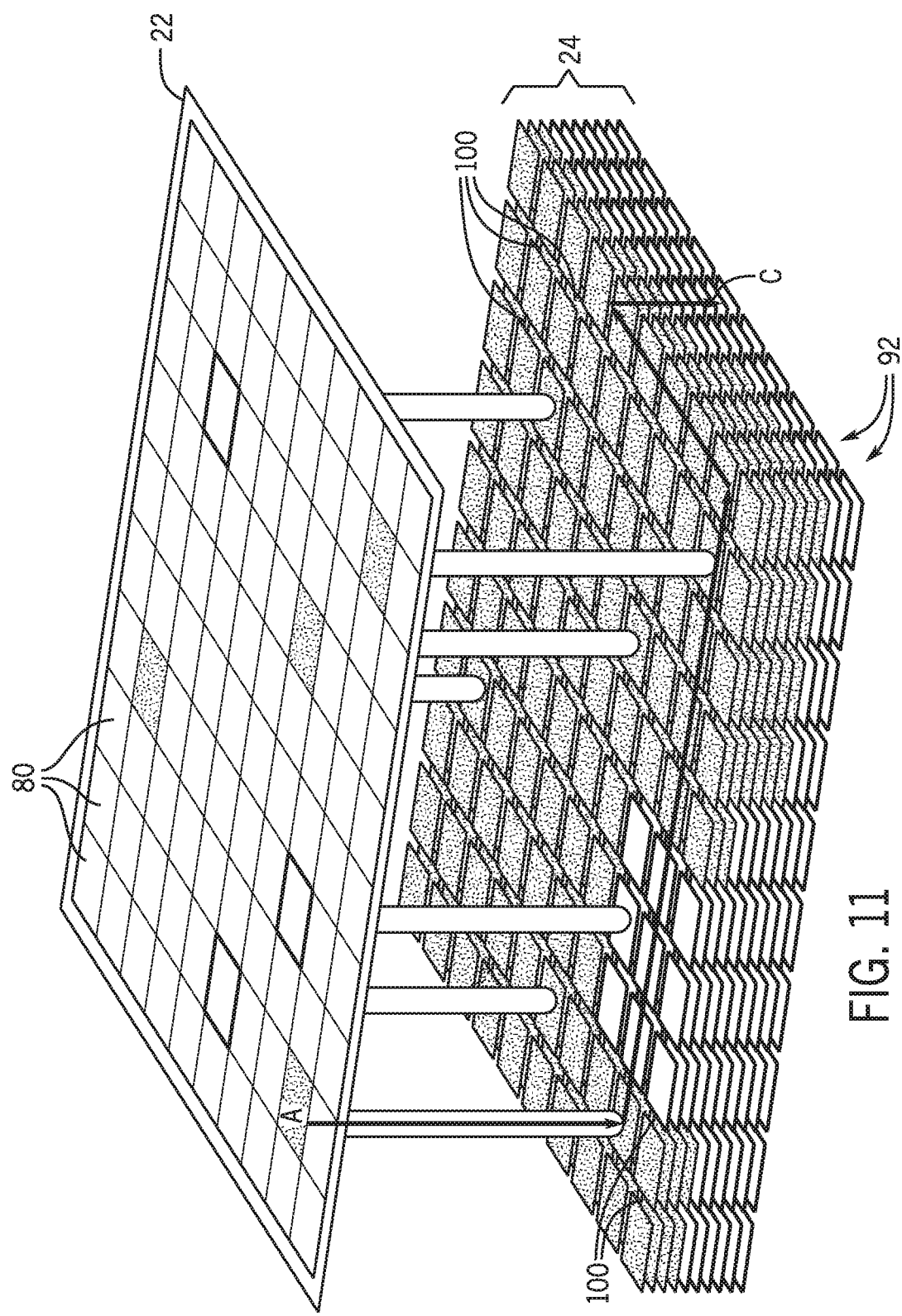
FIG. 11 is an example of data transfer from a sector of the programmable logic fabric to a memory of the sector-aligned memory using the system of FIG. 9.

In another example, FIG. 11 includes a block diagram of illustrating the transfer of data from a sector 80 of the programmable logic fabric to a region of the sector-aligned memory 92 via the NOC circuitry 100 of the base die 24. Referring to FIG. 11, in one embodiment, the sector controller (SC) 58 may initiate a transfer of data from sector "A" of the fabric die 22 to region "C" of the sector-aligned memory 92 using the NOC 100 of the base die 24. That is, the sector controller (SC) 58 may transfer data to a first region of the sector-aligned memory 92 aligned with sector "A" of the fabric die 22 and use the NOC 100 to transfer the data to region "C" of the sector-aligned memory 92 via different regions of the sector-aligned memory 92 or the like. Like FIG. 10, although the route of the data transfer illustrated in FIG. 11 corresponds to straight paths, it should be noted that the data transferred to different regions of the sector-aligned memory 92 may use a variety of directions and routes. It should be noted that other suitable circuits may also be employed to transfer the data in accordance with the embodiments presented herein.

As shown in FIGS. 10 and 11, the sector controller (SC) 58 may initiate a transfer of data directly between memory locations within the base die 24 using the NOC system 100. In this case, the sector controller (SC) 58 may act as the master to initiate the transfer, but then the transfers would be performed directly in the sector-aligned memory 92 and the NOC system 100 of the base die 24 after the sector controller (SC) 58 initiates the transfer. It should also be mentioned that, in some embodiments, that the sector controller (SC) 58 or a soft controller and similar components of the fabric die 22 may also initiate the components (e.g., memory control circuitry 93, non-user input control circuitry 94, non-user output control circuitry 95) of the base die 24 to perform transfers between the sector-aligned memory 92, the peripheral circuitry 28, and other components attached to the base die. As a result, data transfers may occur in the base die 24 without involvement of components in the fabric die 22.

In certain embodiments, the NOC system 100 may also enable the programmable logic device 12 to provide security isolation for one or more of the programmable logic sectors 48. That is, the NOC system 100 may be employed to communicate certain sensitive or secure data to a portion of programmable logic sectors 48 that may be designated as a security portion of the programmable logic device 12. Third party programmers may be unable to access the security portion of the programmable logic device 12 without access to the NOC system 100. Instead, the NOC system 100 may be limited to communication by certain programmers with a level of security credentials.

Figure 12:
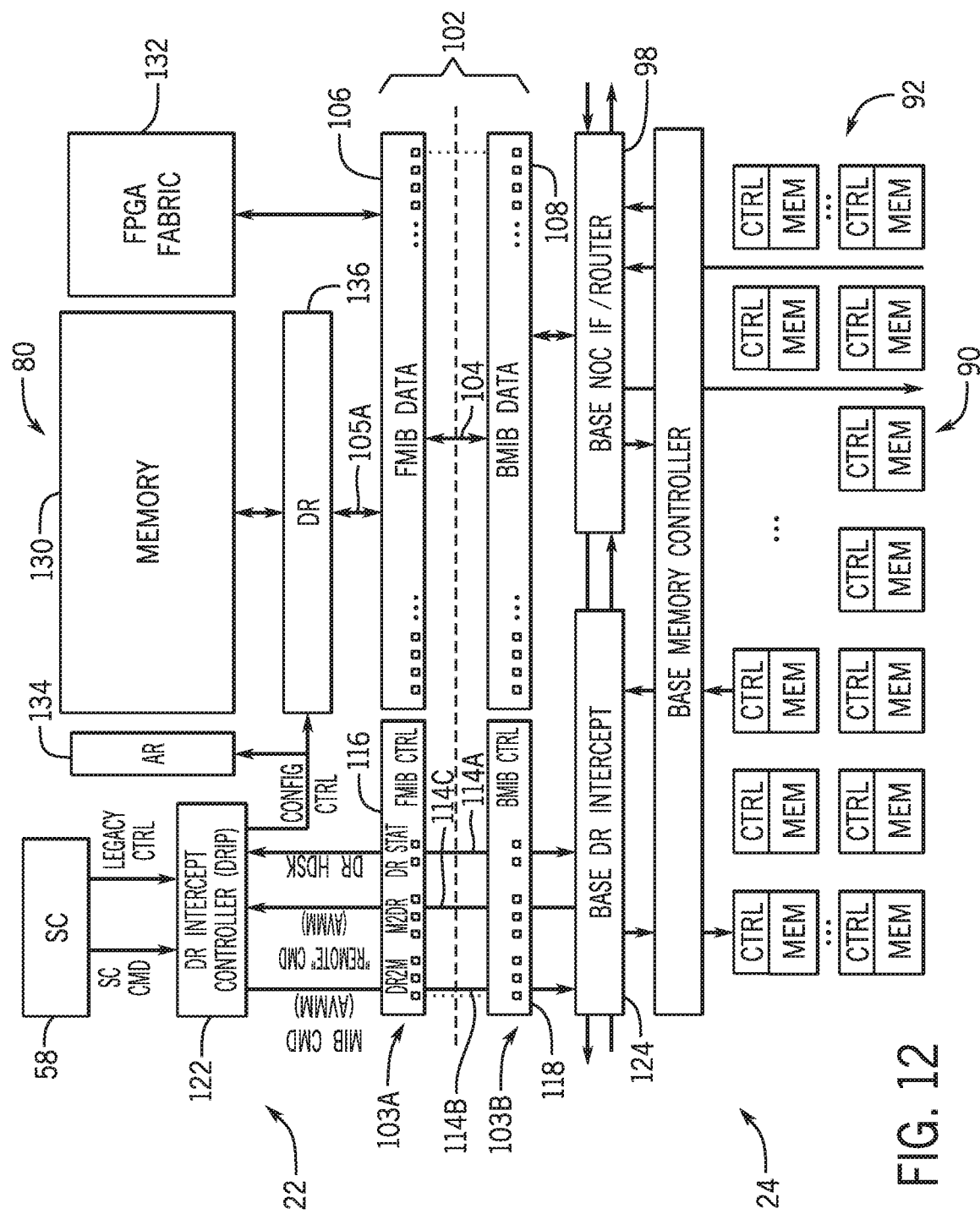
FIG. 12 is a block diagram illustrating a parallel configuration interface to exchange data between embedded memory in the programmable logic die and the sector-aligned memory in the base die, in accordance with an embodiment.

With this in mind, FIG. 12 illustrates one embodiment in which a base die 24 may exchange data with the fabric die 22 via a high-speed parallel interface (e.g., DR intercept (DRIP) interface 102). The DRIP interface 102 may couple the base die 24 and/or the fabric die in a sector-to sector level. For example, a sector 80 in the fabric die 22 may be coupled to a corresponding sector 90 in the base die. The sector 80 of the fabric device may include a sector controller 58, a fabric memory 130, which may be a configuration memory (CRAM) which may include configuration memory 52 and/or user memory 53. Sector 80 may also include FPGA fabric 132, which may include programmable logic elements 50. In some embodiments, read and/or write access to the memory may be performed with the assistance of an address register (AR) 134 and/or a data register (DR 136). The AR 134 and the DR 136 may be used to load data into the fabric memory 130 and/or retrieving data from the fabric memory 130. In some embodiments, the exchange between the fabric memory 130 and the DRIP interface 102 may employ the DR 136.

The DRIP interface 102 may occupy a row or column of a fabric sector 80 and a portion of base die sector 90. The DRIP interface 102 may include interface circuitry in the fabric die 22 (e.g., FMIB 103A) and in the base die 24 (e.g., BMIB 103B). The FMIB 103A and the BMIB 103B may be connected via a high-speed microbump interconnect. The FMIB 103A may include a data exchange block FMIB DATA 106 and a control block FMIB CTRL 116. The BMIB 103B may include a data exchange block BMIB 108 and a control block BMIB CTRL 118. As detailed below, control and command for data operations may be exchanged between control blocks FMBI CTRL 116 and BMIB CTRL 118, and data transfer for the respective commands may be exchanged between data exchange block FMIB 106 and BMIB 108.

The DRIP interface 102 may receive or transmit data via a datapath 104, that may be established between a data exchange block FMIB DATA 106 of the FMIB 103A and a data exchange block BMIB DATA 108 of the BMIB 103B. The data exchange blocks FMIB 103A and BMIB 103B may be coupled through multiple channels, and may be coupled to each other via a microbump interconnect, as discussed herein. In some embodiments, the datapath 104 may be grouped into source synchronous channels (e.g., data is transmitted with clock signal) with individually centered clocks to maximize micro-bump bandwidth. The interface clocking may be used to facilitate communications and data transfer may be clocked using a single data rate (SDR) clocking, a double data rate (DDR) clocking, a quad data rate (QDR) clocking, or a xY interface clocking. The microbump clocking may be x2, x4 or xY faster with narrower data width (/2, /4 or /Y) compared to the internal wider data buses. Based on microbump design requirements, the microbump clock may be single ended or differential clocking. Data microbumps in the datapath 104 may employ unidirectional RX and/or TX channels or common bi-directional channels.

The DRIP interface 102 may also exchange control and/or data signals through a control interfaces 114A, 114B, and 114C. The control interfaces may be established between a control block FMIB CTRL 116 of the FMIB 103A and a control block BMIB CTRL 118 of the BMIB 103B. The control interfaces 114A, 114B, and 114C may be used to coordinate operations between the DRIP controller 122 in the fabric die 22 and the DRIP controller 124 in the base die 124. The control interfaces 114A, 114B, and 114C may coordinate operations to facilitate exchanges of data between the fabric memory 130, the sector-aligned memory 92 of the base die 24, and/or the NOC system 100 via the NOC router 98. Moreover, it should be noted that remote requests to the DRIP interface 102 may arrive via the NOC system 100 in the base die, as detailed below. Moreover, as discussed above, the base die 24 may have additional resources, including vector engines, compute-in-memory, and other circuitry that may generate and/or receive data, and the DRIP interface 102 may be used to exchange data between such circuitry and the fabric memory 130. As with the datapath 104, control interfaces 114A, 114B, and 114C may be source synchronous channels with individually centered clocks to maximize micro-bump bandwidth. The interface clocking may be clocked using a single data rate (SDR) clocking, a double data rate (DDR) clocking, a quad data rate (QDR) clocking, or a xY interface clocking. Based on microbump design requirements, the microbump clock may be single ended or differential clocking. Control microbumps for control interfaces 114A, 114B, and 114C may be unidirectional or bi-directional, as detailed below.

As discussed above, the DRIP controllers 122 and 124 may be implemented using a state machine that may be triggered by events. Events of the state machine may be associated with signals exchanged in the control interfaces 114A-C. The Table 1 illustrates examples of signals that may be used to perform commands and/or functions using the DRIP interface 102. It should be understood that the this Table 1 is a non-limiting illustrative example of certain features in an embodiment of the DRIP interface 102, and that variations and/or extensions to this example are contemplated by this disclosure. Data microbumps for control interfaces 114A-C may employ unidirectional RX and/or TX channels or common bi-directional channels. In some embodiments, the control interface may operate in an asynchronous manner.

TABLE 1

Example of control protocol used to operate DRIP interface 102

| Interface | Description |
|---|---|
| Control interface 114A | Control interface 114A may be used to communicate with handshake protocols between the DRIP controller 122 and the DRIP controller 124. <br> DRIP controller 122 may indicate the sector 80 is ready for DRIP interface operations with a "Ready" signal. <br> DRIP controller 124 may indicate completion status for DRIP interfaces with a "Status" signal. The "Status" signal may include additional coding and, as such, control interface 114A may be implemented using a single or multi-bit bus. |
| Control interface 114B | Command from DRIP controller 122 to controller 124. May be used to request a configuration operation to controller 124. <br> This may be a memory-mapped interface over micro-bumps to push a command to a queue or first-in first-out (FIFO) buffer on the base die 24. A direct command interface may also be used. |
| Control interface 114C | Command from DRIP controller 124 to DRIP controller 122. The command may be a remote command from another sector 80 for a write or read operation. The remote command interface may be used to push a remote DRIP interface command coming via a NOC interface. <br> This may be a memory-mapped interface over micro-bumps to push a command to a queue from the base die 24 to the fabric die 22. A direct command interface may be used. |

The DRIP controller 122 in the fabric die may operate in coordination with the sector controller 58. To that end, DRIP controller 122 may receive instructions from sector controller 58 and control the circuitry in the fabric sector 80 and provide instructions to the AR 134 and the DR 136. For example, DRIP controller 122 may receive commands from the sector controller 58 that may be associated with management of the DRIP interface 102. In such situation, DRIP controller 122 may generate signals for the appropriate control interfaces 114A-C. As discussed above, the DRIP interface 102 may also receive commands from remote circuitry (e.g., circuitry in other sectors or in a different die) via the NOC system 100. In such situation, the DRIP controllers 122 and 124 may arbitrate the remote requests and the sector control requests.

In some situations, the sector controller 58 may provide a legacy command that does not account for operations using the DRIP interface 102. In such situations, the DRIP controller 122 may generate commands (e.g., override commands) that control the AR 134 and the DR 136 based on operations that employ the DRIP interface 102. For example, a sector controller 58 may request loading of configuration data to the fabric memory 130 from data coming from a legacy interface. In such situation, the DRIP controller 122 may, in coordination with the DRIP controller 124, pull the data from the legacy interface and store in the sector-aligned memory 92 for caching purposes, and load the configuration data to the fabric memory 130 via the DRIP interface 102.

Figure 13:
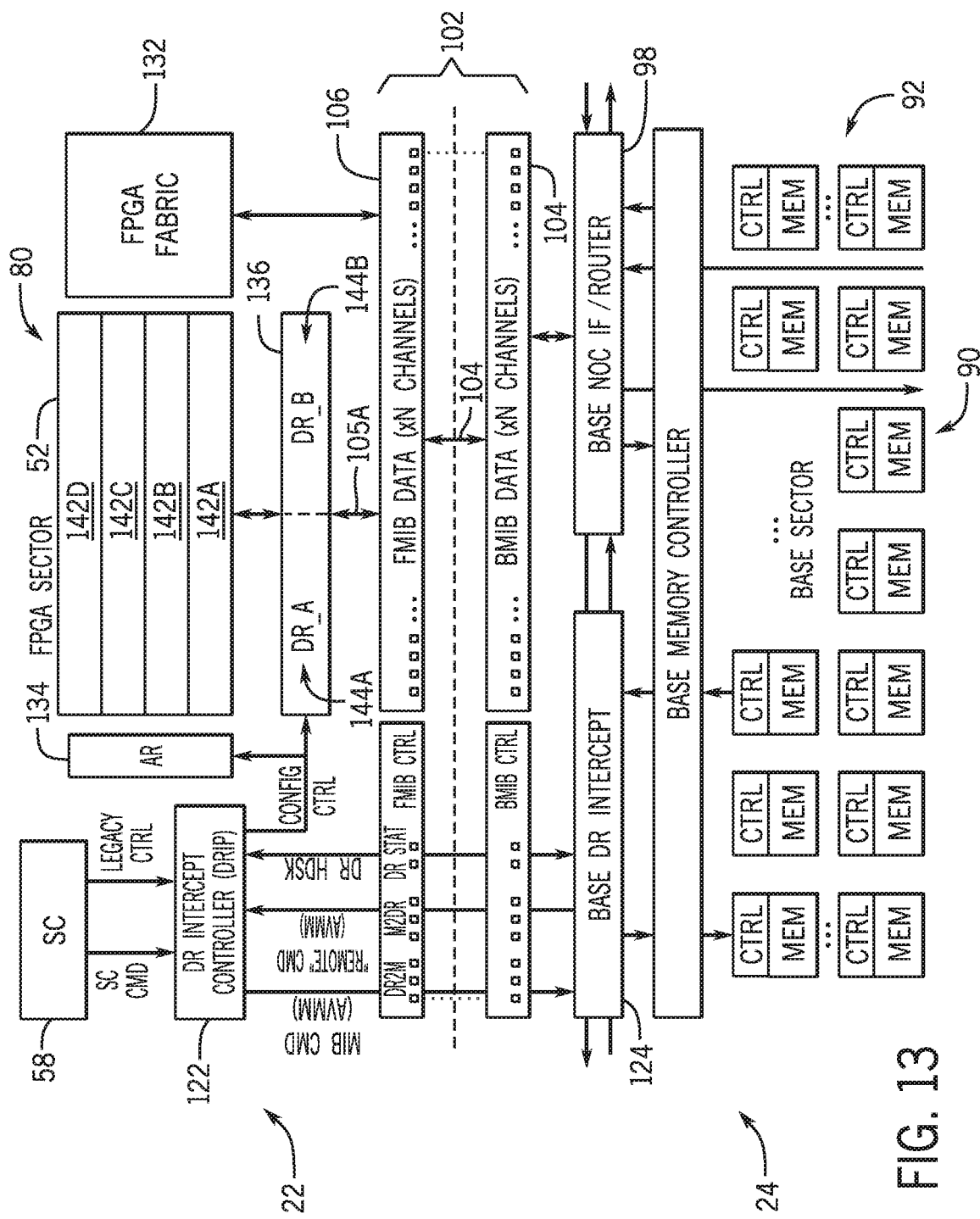
FIG. 13 is a block diagram illustrating a parallel configuration interface to exchange data between configuration memory in the programmable logic die and the sector-aligned memory in the base die, in accordance with an embodiment.

As discussed above, the DRIP interface 102 may be used to read and write data from the sector-aligned memory 92 and configuration memory 52 (e.g., CRAM). An example is illustrated in FIG. 13. Certain elements in FIG. 13 may be similar to like elements of FIG. 12 and such elements are labeled using the same number. In the diagram of FIG. 13, the configuration memory 52 is interacting with the DRIP interface 102. As illustrated, the configuration memory 52 may be divided in memory segments 142A, 142B, 142C, and 142D, which may facilitate implementation of pipelining to increase the writing process. Pipelining is further illustrated in FIGS. 16A and 16B, below.

Moreover, the DR 136 may hold two copies of the configuration data in first segment DR_A 144A and second segment DR_B 144B. In some embodiments, the DR 136 may have two copies of the configuration data that is exchanged with the configuration memory 52. The copies may be stored in DR_A 144A and DR_B 144B. After DR_B 144B is loaded, their contents may be copied into DR_A 144A. In this manner, the DRIP interface 102 may load a full frame of configuration data to DR_B 144B while DR_A 144A is being loaded to the configuration memory 52. The increase in the speed of data obtained using the parallel load of DR_B 144B by the DRIP interface may be smaller than the write time of the configuration memory 52. As a result, the write for the configuration memory 52 may be limited by the write time of the configuration memory 52, and not necessarily by the speed of the interface.

Figure 14:
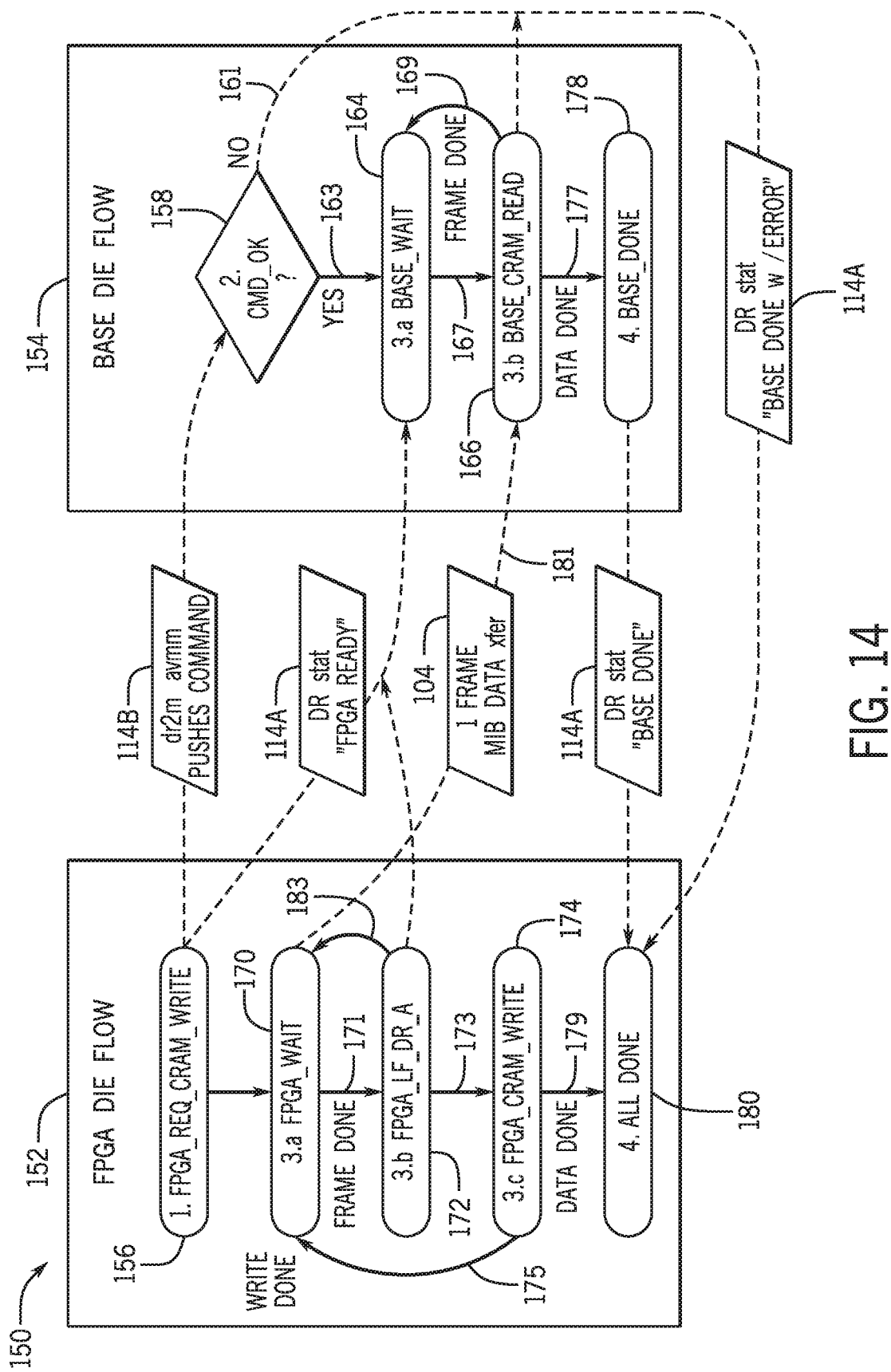
FIG. 14 is a state diagram illustrating an example of operations of the interface controllers in the programmable logic die and the base die for writing configuration memory, in accordance with an embodiment.

The state diagram 150 in FIG. 14 illustrates one example of an operation that may be used for writing data into the configuration memory 52. The state diagram 150 may refer to certain signals, data, and elements illustrated in FIG. 13. The state diagram 150 includes a state machine 152 that may be implemented by a fabric die controller of the DRIP interface (e.g., DRIP controller 122) and a state machine 154 that may be implemented by a base die controller of the DRIP interface (e.g., DRIP controller 124). Control signals may be exchanged using control interfaces 114A-C, and data may be exchanged using datapath 104.

In a first state 156, the state machine 152 may generate a write request for state machine 154. The write request may be pushed through control interface 114B. Upon receiving the write request, the state machine 154 may, in decision state 158, reject the request (e.g., if the base die circuitry is not ready, if the data is not ready, or if access is blocked for security reasons) by transmitting an error message 161 via control interface 114A. The state machine 154 may also accept the request in decision state 158 and enter, via transition 163 into a wait state 164. From wait state 164, the state machine 154 may enter a series of transitions between wait state 164 and CRAM read state 166 through transitions 167 and 169. Transition 167 may be initiated when the state machine 154 receives a "FPGA ready" status through the control interface 114A. During the CRAM read state 166, the state machine 154 may cause a transfer of data 181 (e.g., one frame of configuration data) via a datapath 104.

In the state machine 152 within the fabric die, following the write request in the first state 156, the state machine 152 may send an "FPGA ready" status through the control interface 114A and may enter a wait state 170 in which it receives the data 181. As the data 181 arrives, the data may be loaded to a second segment DR_B 144B. After the data 181 is loaded, the state machine 152 may enter a data loading state 172 through a transition 171. In some embodiments, the data loading state 172 may perform loading from the FMIB DATA 106 to a first segment DR_A 144A from the DR_B 144B segment, which may increase the speed of writing using pipelining techniques. Through a transition 173, the state machine 152 may enter a CRAM writing state 174 in which the data from the DR 136 (e.g., from segment DR_144A) may be loaded to configuration memory 52. In some embodiments, the configuration memory may be written from DR_A 144A to configuration memory 52 while DR_B is being loaded with data 181 from the datapath 104. That is, the read and write operations performed by the DR 136 may be performed simultaneously, which may increase the speed of operation. While there are still frames to be written, transition 175 may take the state machine 152 to the wait state 170. State machine 152 may cycle through states 170, 172, and 174 until all data is written to the configuration memory 52.

Once all data is transferred (e.g., all frames of configuration data are on the fabric die) the state machine 154 may enter the final state 178 through a transition 177 and the state machine 152 may enter the final state 180 through a transition 179. Successful transference of all data may be indicated by a "Done" signal asserted through control interface 114A. Faults in the state machine 154 may be indicated by an error message 161 asserted through control interface 114A. Error message 161 may be generated following the base CRAM read state 166, or any other state. While in this description the write request was initiated in the fabric die (e.g., in DRIP controller 122, in sector controller 58), certain situations may have remote write requests. Remote requests may arrive through the NOC system 100 and/or from a local or remote SC 58. In such situations, the write request may be initiated by the state machine 154 and pushed to state machine 152 through a control interface 114C.

The above writing process may relate to data write process with no pipelining. In embodiments in which device has pipelines, the state machine 152 may include a transition 183 between the wait state 170 and data loading state 172 may be repeated as the pipelined data advances. For example, in a system having N pipelines, states 170 and 172 may be repeated N+1 times for each frame of data 181. Pipelining is further discussed below.

Figure 15:
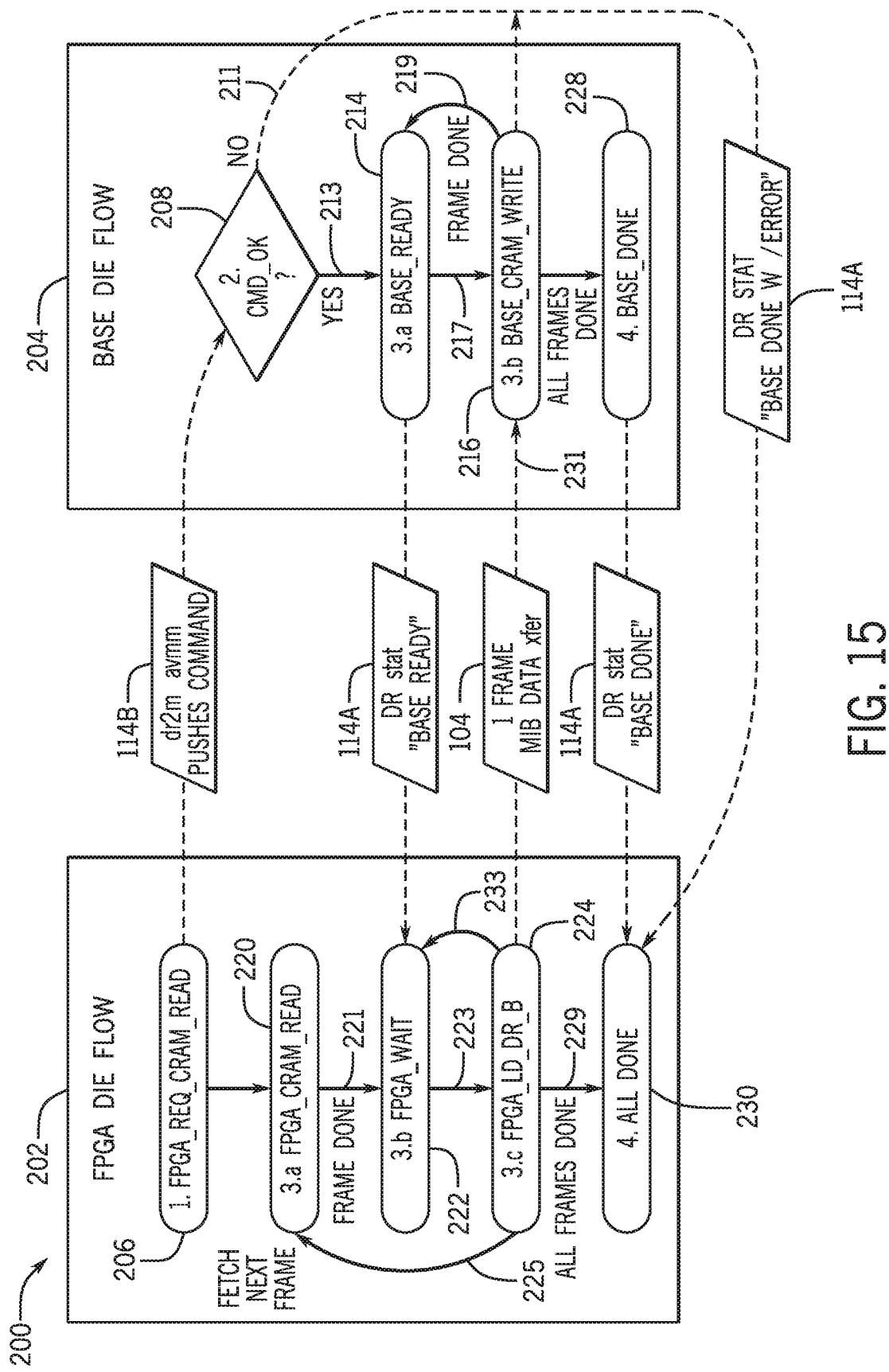
FIG. 15 is a state diagram illustrating an example of operations of the interface controllers in the programmable logic die and the base die for reading configuration memory, in accordance with an embodiment.

The state diagram 200 in FIG. 15 illustrates one example of an operation that may be used for reading configuration data from the configuration memory 52. This process may be performed for caching and/or verification reasons. The state diagram 200 may refer to certain signals, data, and elements illustrated in FIG. 13. The state diagram 200 includes a state machine 202 that may be implemented by a fabric die controller of the DRIP interface (e.g., DRIP controller 122) and a state machine 204 that may be implemented by a base die controller of the DRIP interface (e.g., DRIP controller 124). Control signals may be exchanged using control interfaces 114A-C, and data may be exchanged using datapath 104.

In a first state 206, the state machine 202 may generate a read request for state machine 204. The write request may be pushed through control interface 114B. Upon receiving the write request, the state machine 204 may, in decision state 208, reject the request (e.g., if the base die circuitry is not ready, if the data is not ready, or if access is block for security reasons) by transmitting an error message 211 via control interface 114A. The state machine 204 may also accept the request in decision state 208 and enter, via transition 213 into a base ready state 214. From the base ready state 214, the state machine 204 may enter a series of transitions between base ready state 214 and CRAM write state 216 through transitions 217 and 219. Transition 217 may be initiated by having the state machine 204 sending a "base die ready" status through the control interface 114A. During the CRAM write state 216, the state machine 204 may receive data 231 (e.g., one frame of configuration data) via a datapath 104.

In the state machine 202 on the fabric die, following the read request in the first state 206, the state machine 202 may enter a CRAM read state 220 in which it collects data from the configuration memory 52 and loads the data in the DR 136. In some embodiments, the data may be loaded to the segment DR_A 144A. Once the frame is loaded, the state machine 202 may enter a wait state 222 via a transition 221. Through a transition 223, that may be triggered by a "base die ready" signal through control interface 114A, the state machine 202 may initiate transference of data 231 a data transfer state 224 in which the data from the DR 136 may be transferred to the datapath 104 of the DRIP interface 102. In some embodiments, the data to be transferred may be loaded to one segment in state 220 (e.g., DR_A 144A) from the configuration memory 52, and transferred to the second segment in the data transfer state 224 (e.g., DR_B 144B). In this manner, the next configuration frame may be loaded to DR_A 144A while the previous frame is being transmitted to the base die 24 from DR_B 144B. While there are still frames to be read, transition 225 may take the state machine 202 to the CRAM read state 220. State machine 202 may cycle through states 220, 222, and 224 until all request data is read from the configuration memory 52.

Once all data is transferred (e.g., all frames of configuration data are read) the state machine 204 may enter the final state 228 through a transition 227 and the state machine 202 may enter the final state 230 through a transition 229. Successful transference of all data may be indicated by a "Done" signal asserted through control interface 114A. Faults in the state machine 204 may be indicated by an error message 211 asserted through control interface 114A. Error message 211 may be generated following the base CRAM write state 216, or any other state. While in this description the read request was initiated in the fabric die (e.g., in DRIP controller 122, in sector controller 58), certain situations may have remote write requests. Remote requests may arrive through the NOC system 100 and/or from a local or remote SC 58. In such situations, the write request may be initiated by the state machine 204 and pushed to state machine 202 through a control interface 114C.

The above writing process may relate to data read process with no pipelining. In embodiments in which device employs pipelining, the read state 220 may read multiple frames in a single step, thus loading multiple configuration data frames in each pipeline stage. In a pipelined application, the state machine 202 may include a transition 233 between the data transfer state 224 and wait state 222 which may repeat as the pipelined data advances. For example, in a system having N pipelines, states 224 and 222 may be repeated N+1 times for each frame of data 231. Pipelining is further discussed below.

Figure 16A:
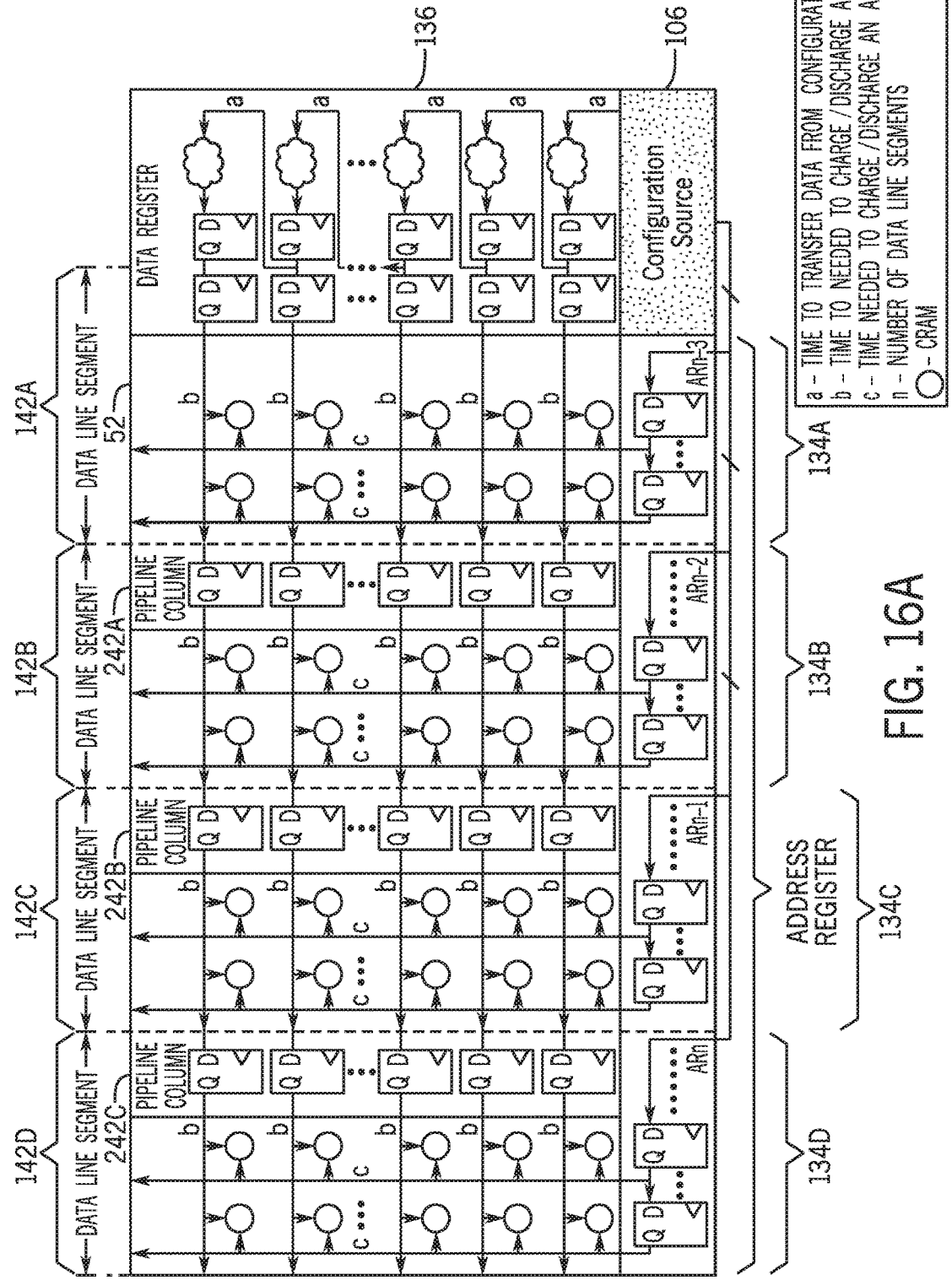
FIG. 16A is a block diagram illustrating configuration memory capable of performing a pipelining process that may be used to accelerate configuration data exchange using the parallel configuration interface, in accordance with an embodiment.
Figure 16B:
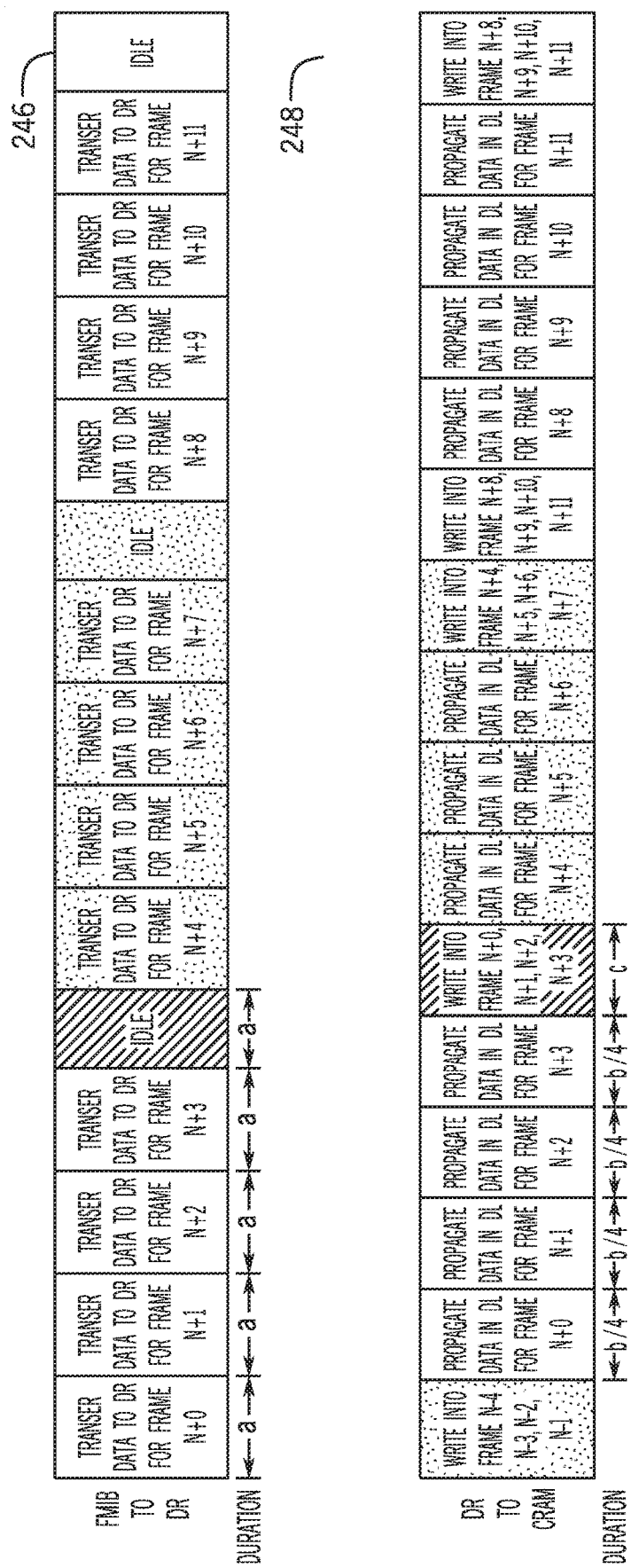
FIG. 16B is a timing diagram illustrating a pipelining process that may be used to accelerate configuration data exchange using the parallel configuration interface, in accordance with an embodiment.

As discussed above, the speed for reading and/or writing data from configuration memory may be increased by the use of pipelining in segmented configuration memory. FIGS. 16A and 16B illustrate an embodiment of a method and/or system for employing pipelining. FIG. 16A is a system diagram that depicts a programmable integrated circuit device including a configuration source, which may be the FMIB DATA 106, a DR 136, that may have two segments DR_A 144A and DR_B 144B, address registers 134A-D, and a segmented CRAM (e.g., configuration memory 52) with memory segments 142A-D, and pipeline columns 242A, 242B, and 242C. Of note, the address register circuitry 134 may include multiple address registers 134A-D. Individual address registers 134A-D allow one data frame per memory segment to be written at a time. As a result, memory segments 142A-D of the configuration memory 52 may be written per device at one time.

The configuration data may be received by a configuration source, which is illustrated in the diagram as the FMIB DATA 106. The configuration data may be transmitted to DR 136. As indicated, the letter "a" corresponds to the amount of time necessary to transfer data from FMIB DATA 106 through DR 136. Once DR 136 has received the data from FMIB DATA 106, DR 136 propagates data from DR 136 to each memory segment 142A-D of the configuration memory 52. In some embodiments, DR 136 may have two segments DR_A 144A and DR_B 144B, as illustrated. Pipeline columns 242A-C allow new data to propagate down each memory segment (e.g., new data may be pipelined down the configuration memory 52 each clock cycle). The letter "b" corresponds to the amount of time needed to charge or discharge a memory segment 142A-D. When the data is propagated to an individual memory segment 142A-D, address register 134A-D corresponding to the memory segment 142A-D is activated, which causes data to be written into configuration memory 52. By way of the steps described above with respect to FIG. 16A, CRAM values are propagated through memory segment to appropriate CRAM cells. Multiple data frames may be programmed at the same time by the CRAM values being pipelined. The frequency of pipelining of the memory segments may depend on a tradeoff between area overhead and configuration time reduction.

According to the above description, the process of programming the data stream from FMIB DATA 106 to configuration memory 52 may be described as follows. First, DR 136 is filled with a configuration data (e.g., portions of bitstream 18) from FMIB DATA 106. Next, data of the configuration data are shifted from DR 136 to adjacent pipeline registers of memory segments 142A-D until the data reaches the furthest memory segment (e.g., memory segment 142D in the illustrate example). In parallel with this process, data corresponding to a next data frame will continue to fill up DR 136 from FMIB DATA 106. Following this process, when all pipeline columns 242A-C of a memory segment 142B-D are full with their respective data, address registers 134A-D may assert commands to write the data into the configuration memory 52. In this manner, multiple data frames are written concurrently (i.e., by writing one data frame per memory segment), thus reducing configuration time.

FIG. 16B depicts a timing diagram that demonstrates a length of time for which each activity described with respect to FIG. 16A may take, in accordance with some embodiments of this disclosure. FIG. 16B may describe the timing for a system such as the one depicted in FIG. 16A, with four memory segments and three pipelining stages. Block 246 illustrates the amount of time "a" it may take to transfer data from FMIB DATA 106 to DR 136. Block 248 illustrates the amount of time it may take to propagate data from the data register 136 to configuration memory 52, by way of memory segment 142A-D. Note that the time to propagate data from DR 136 to configuration memory 52 may be reduced by a factor of 4 in this instance, as each data frame is able to be processed in parallel by the system of FIG. 16A, and there are four data segments, each of which may handle a data frame. Accordingly, the time it takes to write data to configuration memory 52 for a given data frame may be "b" divided by four. Block 248 also demonstrates the amount of time "c" it takes to write the data to the configuration memory, once it has been propagated.

The speed with which memory may be loaded to configuration memory 52 may increase synergistically by joint use of the interface parallelism (e.g., microbump parallelism) and the pipelining process discussed above. For example, the configuration memory 52 may have N pipelines and N+1 memory segments (e.g., memory segments 142A-D). In such system, the DRIP interface 102 may be used to load the segment DR_B 144B of the DR 136, followed by advancement of the pipeline discussed above. At the end of the advancement of the pipeline, DR_A 144A may be loaded with the last frame of the configuration data. In such situation, the pipelines may reduce the time to access the entire configuration memory 52 by a factor of up to 1/(N+1), and the configuration memory 52 write time would be reduced by C/(N+1), wherein C may be a design dependent parameter. As N the number of pipelines increases, the write time for configuration data may approach the raw bandwidth of the DRIP interface 102 (e.g., the bandwidth of datapath 104). While the above description refers to the use of pipelining techniques to store data in the configuration memory, pipelining may be implemented to retrieve data from the configuration memory using techniques similar to the ones described above.

The speed of the configuration data writing process may be further improved by certain design considerations. For example, the ratio of the number of micro-bumps in the datapath 104 to the size of the DR 136 may be balanced to match bandwidths in the data FMIB DATA 106. Match bandwidths may allow the DRIP interface 102 to load the next configuration data frame while the previous configuration data frame is written without buffering. Additional reduction in the configuration of the write time may be also be achieved with sector parallelism, which may be achieved by employing DRIP interfaces 102 in multiple sectors of the programmable logic device simultaneously. The increase in the speed with which configuration data is written to configuration memory may, among other things, improve the performance of partial reconfiguration (or full reconfiguration) by a factor of more than 100 times. This radical reduction in reconfiguration times will greatly improve the speed in, for example, of context switching for FPGA Data Center applications.

Figure 17:
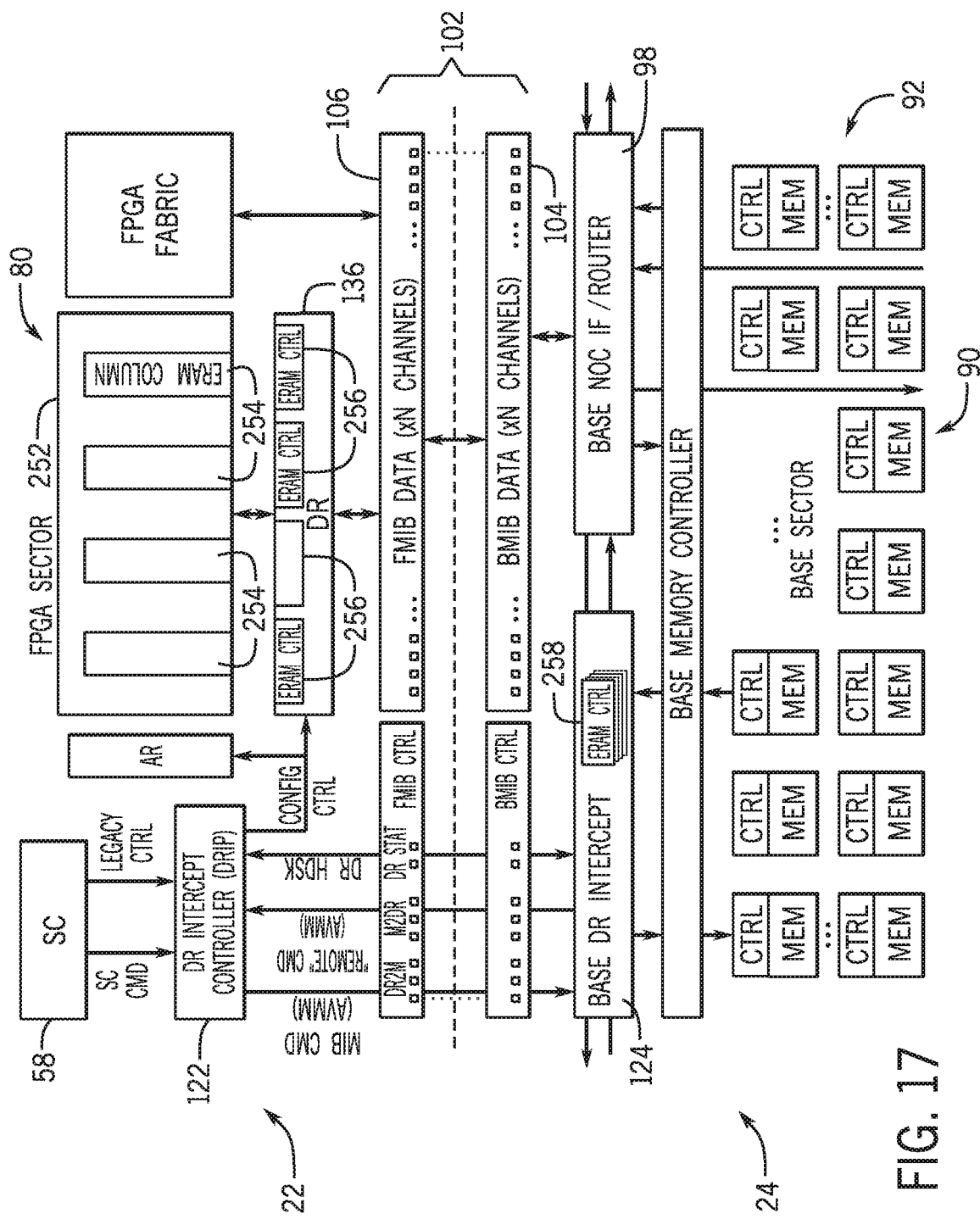
FIG. 17 is a block diagram illustrating a parallel configuration interface to exchange data between user memory in the programmable logic die and the sector-aligned memory in the base die, in accordance with an embodiment.

As discussed above, the DRIP interface 102 may be used to exchange data between the sector-aligned memory 92 and user memory 53 (e.g., ERAM, M20K). An example is illustrated in FIG. 17. Certain elements in FIG. 17 may be similar to like elements of FIG. 12 and such elements are labeled using the same number. In the diagram of FIG. 13, the ERAM memory 252 is interacting with the DRIP interface 102. ERAM memory 252 may mapped by intellectual property (IP) modules, such as ERAM modules, and may be logically arranged in ERAM columns 254. Furthermore, the DR 136 may be logically mapped with ERAM controllers 256. ERAM controllers 256 may directly control (e.g., bind to) channels, or a subset of microbumps of the FMIB DATA 106 to perform data transfer. In some embodiments, the DRIP controller 124 of the base die 24 may have an ERAM controller 258 that may directly control (e.g., bind to) channels, or a subset of microbumps of the BMIB DATA 108, and the bound microbumps may control one or more ERAM controller 256 of the fabric die 22. For example, read and write data buses may map directly to microbumps in the FMIB DATA interface. Control signals such as address signals and read/write enable commands may go across microbumps or may be controlled locally in 256.

As the ERAM controllers 256 and/or 258 may directly control the DRIP interface 102, the transference of user data (e.g., ERAM data) may employ a simpler strategy. For example, a mapping of ERAM controllers 256 and 258 across the microbumps of the DRIP interface 102 may allow circuitry of the base die 24 (e.g., ERAM controller 258) to control ERAM columns in the ERAM memory 252.

Figure 18:
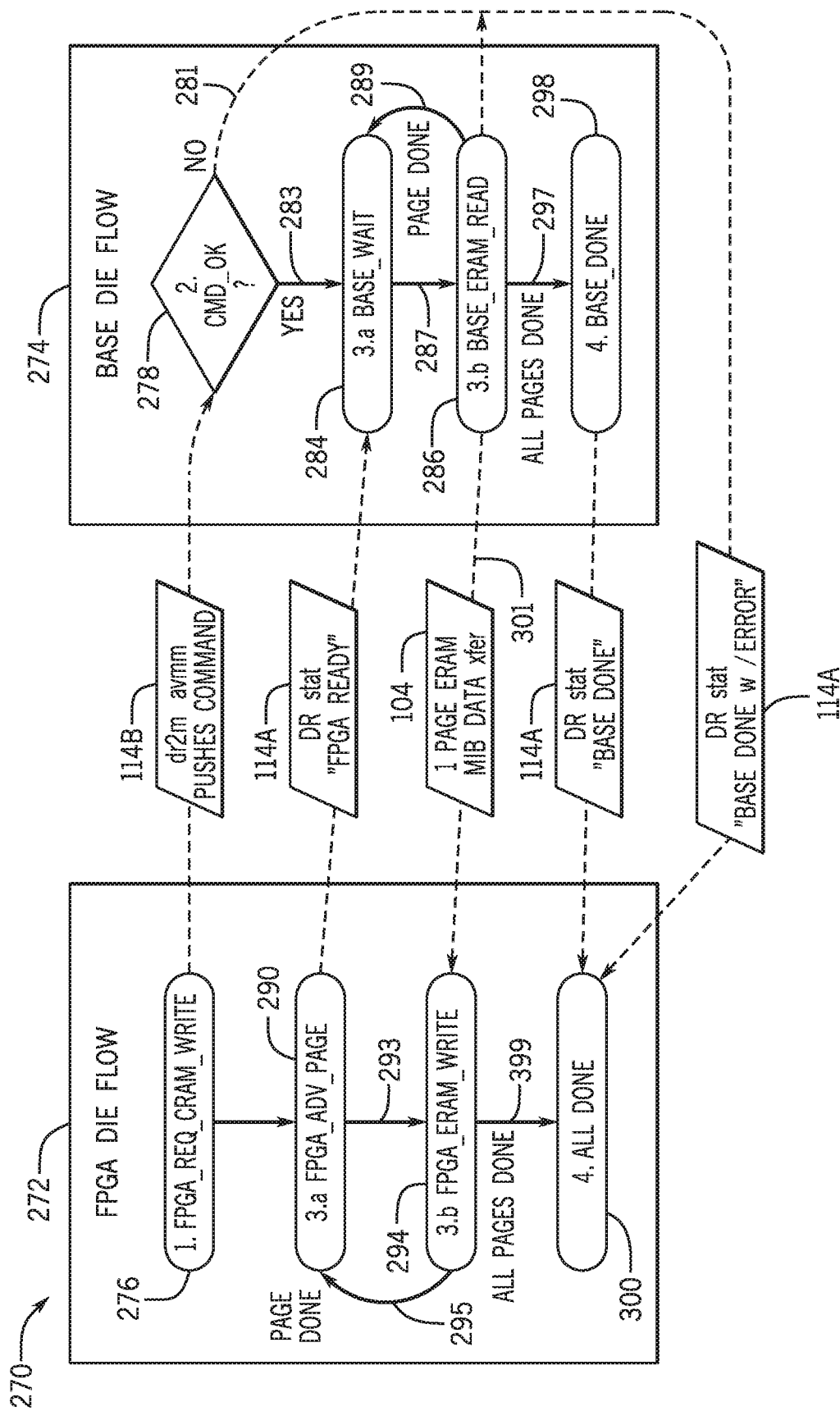
FIG. 18 is a state diagram illustrating an example of operations of the interface controllers in the programmable logic die and the base die for writing user memory, in accordance with an embodiment.

The state diagram 270 in FIG. 18 illustrates one example of an operation that may be used for writing data into the ERAM memory 252. The state diagram 270 may refer to certain signals, data, and elements illustrated in FIG. 17. The state diagram 270 includes a state machine 272 that may be implemented by a fabric die controller of the DRIP interface (e.g., DRIP controller 122) and a state machine 274 that may be implemented by a base die controller of the DRIP interface (e.g., DRIP controller 124). Control signals may be exchanged using control interfaces 114A-C, and data may be exchanged using datapath 104.

In a first state 276, the state machine 272 may generate a write request for state machine 274. The write request may be pushed through control interface 114B. Upon receiving the write request, the state machine 274 may, in decision state 278, reject the request (e.g., if the base die circuitry is not ready, if the data is not ready, or if access is blocked for security reasons) by transmitting an error message 281 via control interface 114A. The state machine 274 may also accept the request in decision state 278 and enter, via transition 283 into a wait state 284. From wait state 284, the state machine 274 may enter a series of transitions between wait state 284 and data read state 286 through transitions 287 and 289. Transition 287 may be initiated when the state machine 274 receives a "FPGA ready" status through the control interface 114A. During the data read state 286, the state machine 274 may initiate a transfer of data 301 (e.g., a page of user data) via a datapath 104.

In the state machine 272 operating in the fabric die, following the write request in the first state 276, the state machine 272 enter a prepare a page to receive data in a page receive state 290 and may send an "FPGA ready" status through the control interface 114A. Following a transition 293, the state machine 272 may enter a write state 294 during which the data 301 is transmitted via datapath 104 to the FPGA. The data 301, received by the FPGA via the datapath 104 may be written to the ERAM memory 252. While there are still pages to be written to the ERAM memory 252, transition 295 may take the state machine 272 to the page receive state 290. State machine 272 may cycle through states 290 and 294 until all pages are written to the ERAM memory 52.

Once all data is transferred (e.g., all pages of the data are on the fabric die) the state machine 274 may enter the final state 298 through a transition 297 and the state machine 272 may enter the final state 300 through a transition 299. Successful transference of all data may be indicated by a "Done" signal asserted through control interface 114A. Faults in the state machine 274 may be indicated by an error message 281 asserted through control interface 114A. Error message 281 may be generated following the data read state 286, or any other state. While in this description the write request was initiated in the fabric die (e.g., in DRIP controller 122, in sector controller 58), certain situations may have remote write requests. Remote requests and/or data may arrive through the NOC system 100 and/or from a remote or local SC 58 or a soft controller. In such situations, the write request may be initiated by the state machine 274 and pushed to state machine 272 through a control interface 114C.

Figure 19:
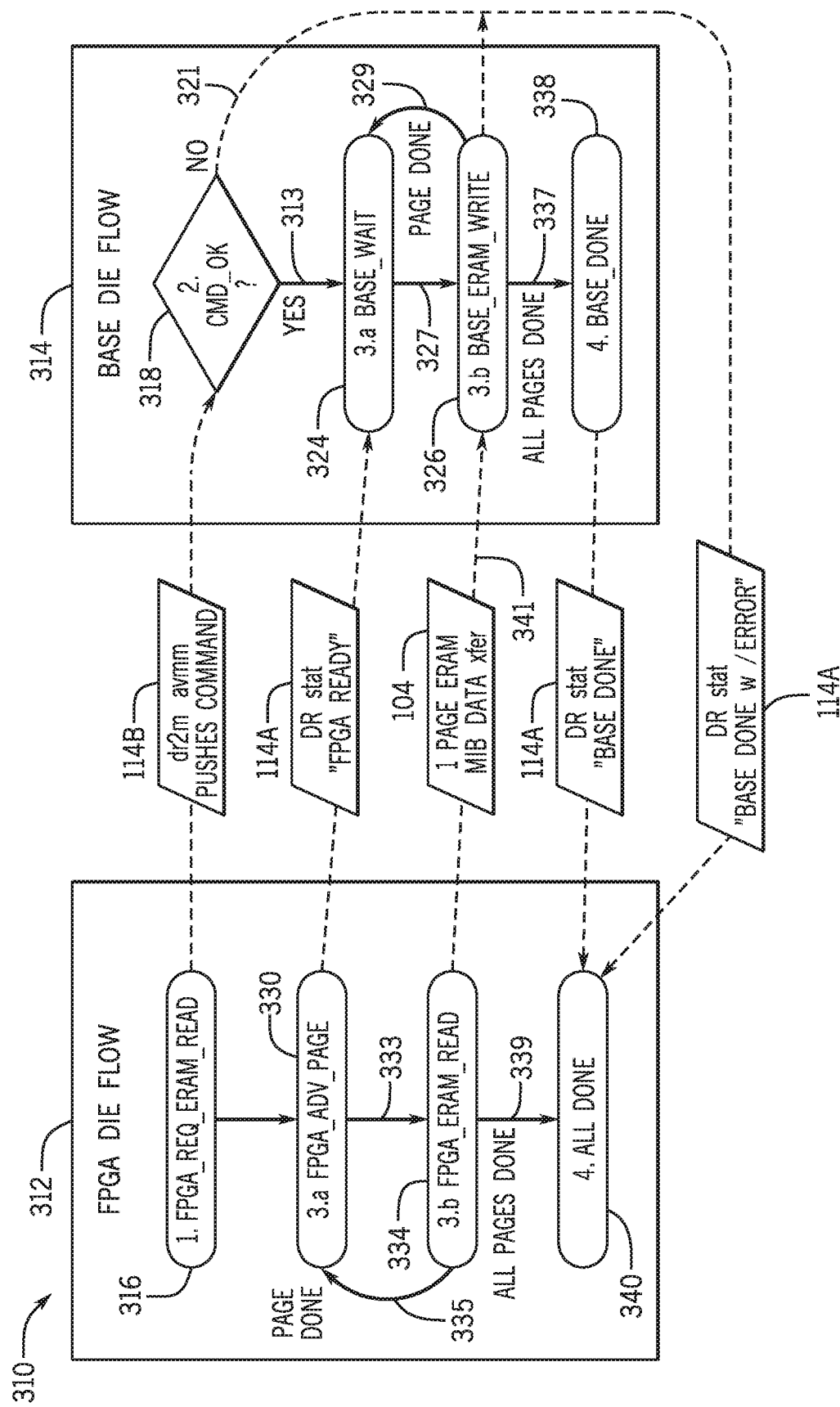
FIG. 19 is a state diagram illustrating an example of operations of the interface controllers in the programmable logic die and the base die for reading using memory, in accordance with an embodiment.

The state diagram 310 in FIG. 19 illustrates one example of an operation that may be used for read data from the ERAM memory 252. The state diagram 310 may refer to certain signals, data, and elements illustrated in FIG. 17. The state diagram 310 includes a state machine 312 that may be implemented by a fabric die controller of the DRIP interface (e.g., DRIP controller 122) and a state machine 314 that may be implemented by a base die controller of the DRIP interface (e.g., DRIP controller 124). Control signals may be exchanged using control interfaces 114A-C, and data may be exchanged using datapath 104.

In a first state 316, the state machine 312 may generate a read request for state machine 314. The read request may be pushed through control interface 114B. Upon receiving the read request, the state machine 314 may, in decision state 318, reject the request (e.g., if the base die circuitry is not ready, if the data is not ready, or access is blocked for security reasons) by transmitting an error message 321 via control interface 114A. The state machine 314 may also accept the request in decision state 318 and enter, via transition 313 into a wait state 324. From wait state 324, the state machine 314 may enter a series of transitions between wait state 324 and data write state 326 through transitions 327 and 329. Transition 327 may be initiated when the state machine 314 receives a "FPGA ready" status through the control interface 114A. During the data write state 326, the state machine 274 may generate requests 342 for data and/or receive data 341 (e.g., a page of user data) via a datapath 104. As discussed above, the control circuitry in the base die may have direct access to the ERAM memory 252. Accordingly, the requests 342 may include direct memory commands, such as address commands or read enable commands. The received data 341 may be stored in a sector-aligned memory 92 or transfer via a NOC system 100.

In the state machine 312 operating in the fabric die, following the read request in the first state 316, the state machine 312 may control fabric die circuitry to prepare a read of the next page, by setting up address lines for the next page in a set up next page state 330. State machine 312 may send an "FPGA ready" status through the control interface 114A and, following a transition 333, enter a read state 334 during which the data 341 is transmitted to the base die via datapath 104. Data 341 may be provided in response to requests 342 generated in the base die, as discussed above. While there are still pages to be read from the ERAM memory 252, transition 335 may take the state machine 312 to the set up next page state 330. State machine 312 may cycle through states 330 and 334 until all pages are written to the ERAM memory 252.

Once all data is transferred (e.g., all pages of the data are retrieved from the he fabric memory) the state machine 314 may enter the final state 338 through a transition 337 and the state machine 312 may enter the final state 340 through a transition 339. Successful transference of all data may be indicated by a "Done" signal asserted through control interface 114A. Faults in the state machine 314 may be indicated by an error message 321 asserted through control interface 114A. Error message 321 may be generated following the data write state 326, or any other state. While in this description the read request was initiated in a local sector of the fabric die (e.g., in DRIP controller 122, in sector controller 58), certain situations may have remote write requests. Remote requests and/or data may arrive through the NOC system 100 and/or from a local or remote SC 58, or from a soft controller. In such situations, the write request may be initiated by the state machine 314 and pushed to state machine 312 through a control interface 114C.

Figure 20:
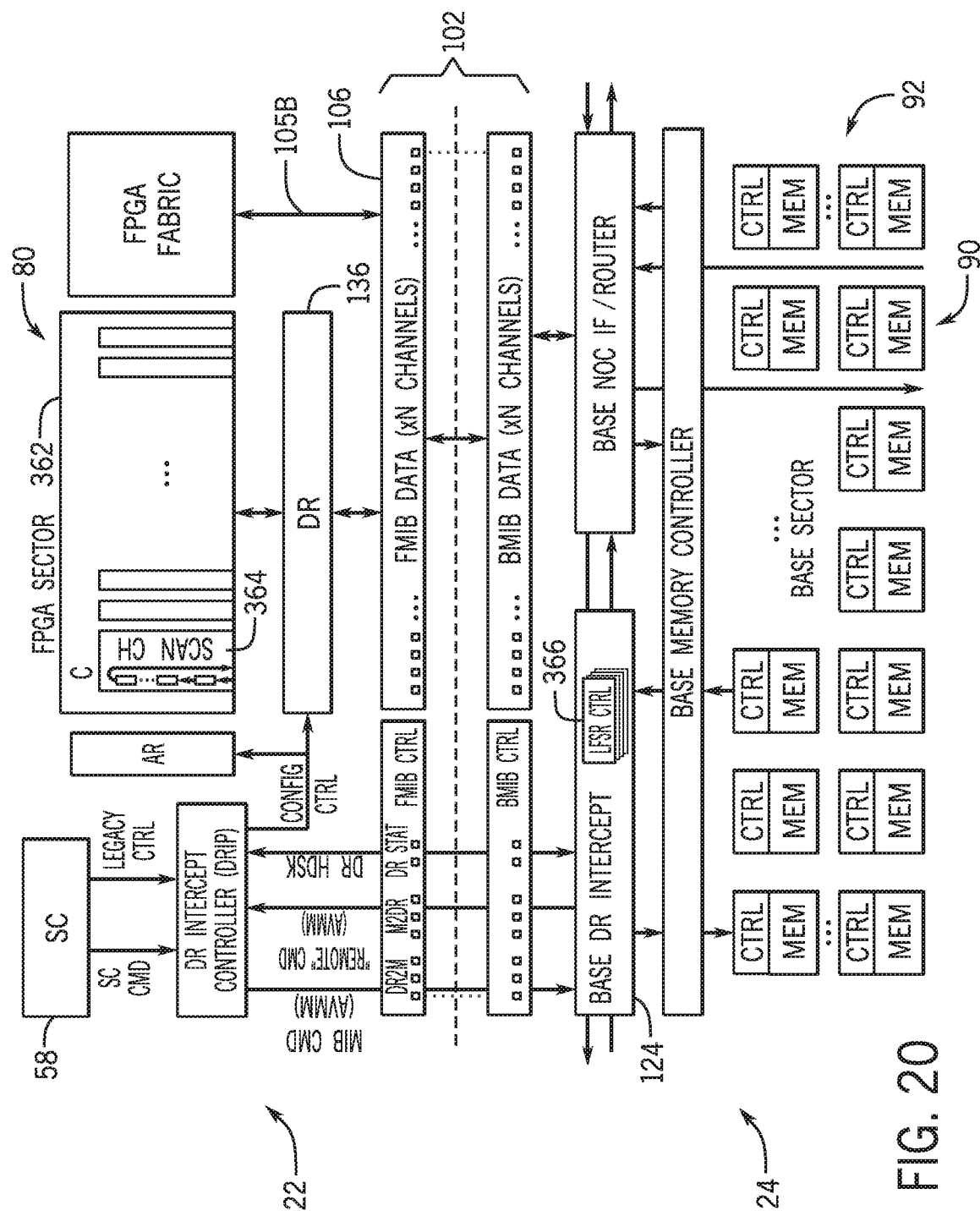
FIG. 20 is a block diagram illustrating a parallel configuration interface to perform register scans in the programmable logic die, in accordance with an embodiment.

Furthermore, as discussed above, the DRIP interface 102 describe herein may be used to accelerate testing of programmable logic devices, register scans (REGSCANs), and/or emulation of application-specific integrated circuits (ASICs) using readback or writeback of registers. An example is illustrated in FIG. 20. Certain elements in FIG. 20 may be similar to like elements of FIG. 12 and such elements are labeled using the same number. In the diagram of FIG. 20, the DRIP interface 102 may be used to access scan chains 364 from fabric registers 362 of the fabric die 22. Fabric registers 362 may include fabric flip flops in the programmable fabric, such as logic elements, DSPs, and/or registers that control the memories. Scan chains 364 may be used for example, in association with automated testing pattern generator (ATPG) testing. The data exchange between the scan chains 364 and the base die 24 may be bidirectional. For example, a test pattern, generated in the base die 24 or retrieved from sector-aligned memory 92, may be pushed to a scan chain 364 via the DRIP interface 102. The return data from the scan chains may be stored directly to sector-aligned memory 92, or may be verified (e.g., using a XOR operation) with a free running linear feedback shift register (LFSR) in a return data checker 366. The resulting syndrome from the verification operation, which may be more compact than the return data, may be stored and checked. While in the illustrated system the return data checker 366 is disposed in the DRIP controller 124, the return data checker 366 may be disposed in any other region of the base die 24. Multiple parallel scan chains 364 may be tested in parallel by having several return data checkers 366 in base die 24 to match the number data microbumps in datapath 104. In combination with the sector-sector parallelism, the use of the DRIP interface 102 may decrease test times (e.g., ATPG test times) by over 100 times.

Figure 21:
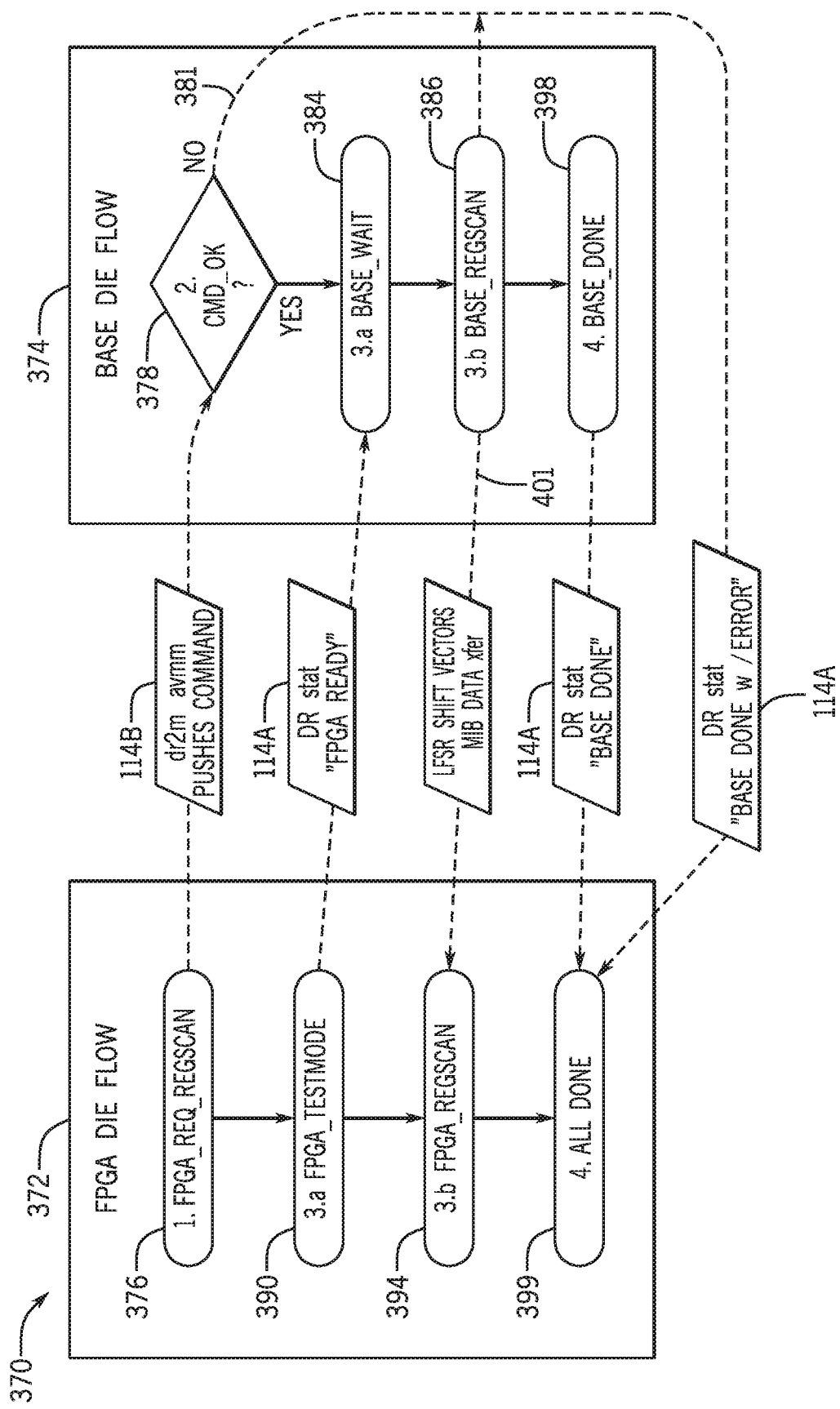
FIG. 21 is a state diagram illustrating an example of operations of the interface controllers in the programmable logic die and the base die for performing register scans, in accordance with an embodiment.

The state diagram 370 in FIG. 21 illustrates one example of an operation that may be used to perform REGSCAN testing of FPGA register scan chains from fabric registers 362 of the fabric die 22. The state diagram 370 may refer to certain signals, data, and elements illustrated in FIG. 20. The state diagram 370 includes a state machine 372 that may be implemented by a fabric die controller of the DRIP interface (e.g., DRIP controller 122) and a state machine 374 that may be implemented by a base die controller of the DRIP interface (e.g., DRIP controller 124). Control signals may be exchanged using control interfaces 114A-C, and data may be exchanged using datapath 104.

In a first state 376, the state machine 372 may generate a REGSCAN request for state machine 374. The REGSCAN request may be pushed through control interface 114B. Upon receiving the REGSCAN request, the state machine 374 may, in decision state 378, reject the request (e.g., if the base die circuitry is not ready, or if access is denied for security reasons) by transmitting an error message 381 via control interface 114A. The state machine 374 may also accept the request in decision state 378 and enter, into a wait state 384. From wait state 384, the state machine 374 may enter a base die REGSCAN state 386 when the state machine 374 receives a "FPGA ready" status through the control interface 114A. Similarly, in the state machine 372 operating in the fabric die, the state machine may enter a test mode state 390, send an "FPGA ready status" through control interface 114A, and enter a fabric die REGSCAN state 394.

In the REGSCAN states 386 and 394, the fabric die 22 and the base die 24 may exchange testing data 401 (e.g., ATPG test patterns, LF SR shift vectors) via a datapath 104. For example, circuitry in the base die 24 may generate a test pattern and push FPGA scan-in data as testing data 401 to the fabric die 22. The fabric die 22 may receive the scan-in data, drive a scan chain 364, collect scan-out data, and push the scan-out data as testing data 401 to the base die 24. Scan data may go directly to and from the sector-aligned memory 92, to LSFR checker 366, and/or to the NOC system 100 in the base die 24.

Once the test is completed (e.g., all test patterns were checked) the state machines 372 and 374 may enter the final states 399 and 398, respectively. Successful testing may be indicated by a "Done" signal asserted through control interface 114A, such as following an LSFR syndrome check pass. Faults detected during testing may be indicated by the state machine 314 using an error message 381 asserted through control interface 114A. Error message 381 may be provide information that may assist in diagnosing and/or correcting errors in the fabric registers 362 of the fabric die 22, such as after an LSFR syndrome check fail. While in this description the REGSCAN request was initiated in the fabric die (e.g., in DRIP controller 122, in sector controller 58), certain situations may have remote write requests. Remote requests and/or data may arrive through the NOC system 100 and/or from a local or remote SC 58 or a soft controller. In such situations, the write request may be initiated by the state machine 374 and pushed to state machine 372 through a control interface 114C.

Figure 22:
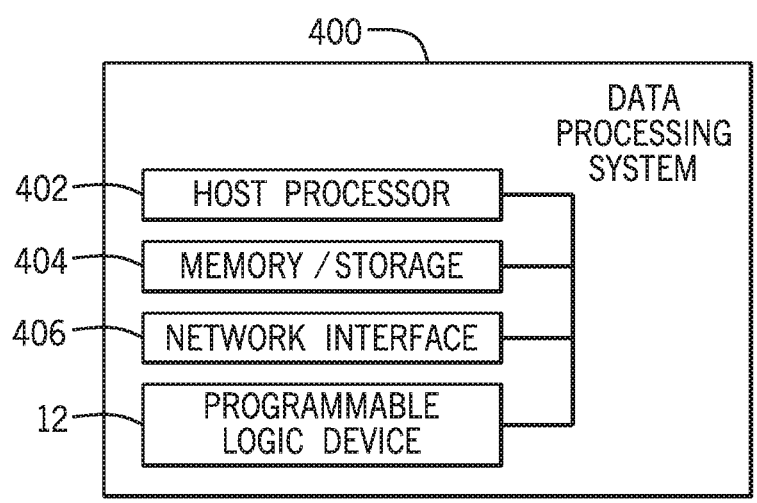
FIG. 22 is a block diagram of a data processing system that may use the programmable logic device to rapidly respond to data processing requests, in accordance with an embodiment.

The programmable logic device 12 may be, or may be a component of, a data processing system. For example, the programmable logic device 12 may be a component of a data processing system 400, shown in FIG. 22. The data processing system 400 includes a host processor 402, memory and/or storage circuitry 404, and a network interface 406. The data processing system 400 may include more or fewer components (e.g., electronic display, user interface structures, application specific integrated circuits (ASICs)). The host processor 402 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 400 (e.g., to perform machine learning, video processing, voice recognition, image recognition, data compression, database search ranking, bioinformatics, network security pattern identification, spatial navigation, or the like). The memory and/or storage circuitry 404 may include random access memory (RAM), read-only memory (ROM), one or more hard drives, flash memory, or the like. The memory and/or storage circuitry 404 may be considered external memory to the programmable logic device 12 and may hold data to be processed by the data processing system 400. In some cases, the memory and/or storage circuitry 404 may also store configuration programs (bitstreams) for programming the programmable logic device 12. The network interface 406 may allow the data processing system 400 to communicate with other electronic devices. The data processing system 400 may include several different packages or may be contained within a single package on a single package substrate.

In one example, the data processing system 400 may be part of a data center that processes a variety of different requests. For instance, the data processing system 400 may receive a data processing request via the network interface 406 to perform machine learning, video processing, voice recognition, image recognition, data compression, database search ranking, bioinformatics, network security pattern identification, spatial navigation, or some other specialized task. The host processor 402 may cause the programmable logic fabric of the programmable logic device 12 to be programmed with a particular accelerator related to requested task. For instance, the host processor 402 may instruct that configuration data (bitstream) stored on the memory/storage 404 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 400 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically embedded programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . " it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An integrated circuit device comprising:
   a first integrated circuit die comprising first circuitry that comprises a memory, a register, or both, and a first controller for a microbump interface, wherein the register comprises a plurality of memory controllers and a data register configured to couple the microbump interface and the first circuitry, wherein the first controller is configured to control the plurality of memory controllers; and
   a second integrated circuit die connected to the first integrated circuit die via the microbump interface and comprising a second controller for the microbump interface, wherein the first controller and the second controller are coupled via a control interface that comprises a microbump connection.

2. The integrated circuit device of claim 1, wherein the memory comprises an embedded random-access memory (ERAM).

3. The integrated circuit device of claim 1, wherein the first integrated circuit die comprises programmable logic, the memory comprises configuration memory that controls the programmable logic, and the microbump interface is configured to transport configuration data from the second integrated circuit die to the first integrated circuit die or from the first integrated circuit die to the second integrated circuit die.

4. The integrated circuit device of claim 3, wherein the configuration memory comprises a plurality of memory segments, and wherein the data register is configured to load the configuration data employing pipelining.

5. The integrated circuit device of claim 3, wherein the second integrated circuit die comprises a network on chip (NOC) circuitry, and wherein the configuration data is received from the NOC circuitry.

6. The integrated circuit device of claim 3, wherein the second integrated circuit die comprises a second memory that comprises the configuration data.

7. The integrated circuit device of claim 1, wherein the second integrated circuit die comprises testing circuitry, and wherein the data register is configured to load test data into a scan chain that comprises the register and to retrieve return data from the scan chain to the testing circuitry.

8. The integrated circuit device of claim 7, wherein the testing circuitry comprises a linear feedback shift register (LFSR) checker.

9. The integrated circuit device of claim 7, wherein the testing circuitry comprises a test pattern generator that generates the test data.

10. The integrated circuit device of claim 9, wherein the test pattern generator comprises a linear feedback shift register (LFSR) generator.

11. The integrated circuit device of claim 1, comprising a third integrated circuit die coupled to the second integrated circuit die via a second microbump interface, wherein the third integrated circuit die comprises second circuitry that comprises a second memory or a second register or both, and a third controller for the second microbump interface, and wherein the second integrated circuit die comprises a fourth controller for the second microbump interface that is coupled to the third controller via a second control interface that comprises a second microbump connection.

12. A method to program a programmable logic device, comprising:

sending a write request from a first controller of a microbump interface disposed in a fabric die to a second controller of the microbump interface disposed in a base die using a first control interface that comprises a microbump connection, wherein the fabric die and the base die are coupled via the microbump interface;

transmitting a first portion of configuration data from a memory in the base die to a data register in the fabric die using the microbump interface, wherein the microbump interface comprises a plurality of channels; and loading the first portion of the configuration data from the data register to a configuration memory of the fabric die.

13. The method of claim 12, wherein loading the first portion of configuration data from the data register to the configuration memory comprises:

storing the first portion of the configuration data received from the microbump interface in a first segment of the data register;

copying the first portion of the configuration data from the first segment of the data register to a second segment of the data register; and transferring the first portion of the configuration data from the second segment of the data register to the configuration memory.

14. The method of claim 12, wherein the configuration memory comprises a plurality of pipeline segments, and wherein loading the first portion of the configuration data comprises:

loading the first portion of the configuration data in a first pipeline segment of the memory; and simultaneously shifting the first portion of the configuration data in the first pipeline segment of the memory to a second pipeline segment of the memory and storing a second portion of the configuration data in the first pipeline segment of the memory.

15. The method of claim 12, wherein the base die comprises network on chip (NOC) circuitry, and wherein the method comprises:

receiving, in the base die, the first portion of the configuration data via the NOC circuitry; and storing the first portion of the configuration data in the memory in the base die.

16. The method of claim 12, comprising:

receiving, in the first controller, a legacy write request from a sector controller of the fabric die; and generating, in the first controller, the write request based, in part, on the legacy write request.

17. The method of claim 12, comprising transmitting a second portion of the configuration data from the memory in the base die to the data register in the fabric die using the microbump interface while loading the first portion of configuration data from the data register to the configuration memory of the fabric die.

18. The method of claim 17, wherein the plurality of channels comprises a first bandwidth, the data register comprises a second bandwidth, and wherein transmitting the first portion of configuration data comprises receiving the first portion of the configuration data in the first control interface at a first frequency and the first bandwidth and providing the first portion of the configuration data from the first control interface to the data register at a second frequency and the second bandwidth.

19. An electronic device, comprising:

a fabric die that comprises:
  programmable fabric;
  configuration memory configured to program the programmable fabric; and
  a first controller for a microbump interface; and a base die coupled to the fabric die via the microbump interface, comprising a second controller for the microbump interface coupled to the first controller via a microbump connection, wherein the first controller and the second controller are configured to control exchange of configuration data between the base die and the configuration memory via the microbump interface, wherein the exchange comprises:

sending a write request from the first controller to the second controller using a first control interface that comprises the microbump connection;

transmitting a first portion of configuration data from a memory in the base die to a data register in the fabric die using the microbump interface, wherein the microbump interface comprises a plurality of channels; and loading the first portion of the configuration data from the data register to the configuration memory of the fabric die.

20. The electronic device of claim 19, wherein the fabric die comprises user memory, and wherein the first controller and the second controller are configured to control exchange of user data between the base die and the user memory via the microbump interface.

21. The electronic device of claim 19, comprising a data processing system comprising the fabric die and the base die.

22. The electronic device of claim 21, wherein the data processing system is configured to perform machine learning, video processing, voice recognition, image recognition, data compression, database search ranking, bioinformatics, network security pattern identification, or spatial navigation, or any combination thereof.

23. The electronic device of claim 21, wherein the data processing system comprises vector engines, compute-in-memory, or application-specific integrated circuit (ASIC) emulation, or any combination thereof.

24. The electronic device of claim 19, wherein the base die comprises first testing circuitry, and wherein the first controller and the second controller are configured to perform a diagnostic test in the fabric die.

25. The electronic device of claim 24, wherein the first testing circuitry comprises a return data checker configured to perform a linear feedback shift register (LFSR) verification.

26. The integrated circuit device of claim 1, wherein the first controller and the second controller are configured to control an exchange of user data between the second integrated circuit die and the first integrated circuit die via the microbump connection.

27. The electronic device of claim 19, wherein the base die comprises a network on chip (NOC) circuitry, and wherein the configuration data is received by the fabric die from the NOC circuitry.

* * * * *